US012756394B2

(12) United States Patent
Kitahara et al.

(10) Patent No.: US 12,756,394 B2
(45) Date of Patent: Oct. 6, 2026

(54) SEMICONDUCTOR RELAY AND ELECTRIC CIRCUIT COMPRISING SAME

(71) Applicant: Panasonic Intellectual Property Management Co., Ltd., Osaka (JP)

(72) Inventors: Daisuke Kitahara, Osaka (JP); Shinsuke Taka, Mie (JP); Yoshiyuki Kajimoto, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 298 days.

(21) Appl. No.: 18/710,051

(22) PCT Filed: Sep. 14, 2022

(86) PCT No.: PCT/JP2022/034355
§ 371 (c)(1),
(2) Date: May 14, 2024

(87) PCT Pub. No.: WO2023/095423
PCT Pub. Date: Jun. 1, 2023

(65) Prior Publication Data

US 2026/0172029 A1 Jun. 18, 2026

(30) Foreign Application Priority Data

Nov. 26, 2021 (JP) ................................ 2021-191714

(51) Int. Cl.
*H03K 17/785* (2006.01)
*H10D 80/20* (2026.01)
*H10W 90/00* (2026.01)

(52) U.S. Cl.
CPC ......... *H03K 17/785* (2013.01); *H10D 80/251* (2025.01); *H10W 90/753* (2026.01)

(58) Field of Classification Search
CPC .... H03K 17/785; H03K 17/62; H10D 80/251; H10W 90/753; H01L 24/80; H01L 21/4853
(Continued)

(56) References Cited

U.S. PATENT DOCUMENTS

2012/0199851 A1* 8/2012 Hoshino ............... H10F 55/155
257/E31.103
2015/0069422 A1* 3/2015 Tanaka .................... H10F 55/25
257/79
(Continued)

FOREIGN PATENT DOCUMENTS

JP 2011-166077 A 8/2011
JP 5491894 B2 5/2014
(Continued)

OTHER PUBLICATIONS

International Search Report dated Dec. 13, 2022 issued in International Patent Application No. PCT/JP2022/034355, with English translation.

*Primary Examiner* — Rexford N Barnie
*Assistant Examiner* — Swarna N Chowdhuri
(74) *Attorney, Agent, or Firm* — Rimon P.C.

(57) ABSTRACT

A semiconductor relay includes first and second input terminals, a light emitting element, a light-receiving drive element that includes a light receiving element, first and second output terminals, first and second MOSFET elements, and a sealing resin. The light emitting element and the light receiving element face each other at a predetermined interval. A first surface of the first MOSFET element is placed on the first element placement part of the first output terminal, and a first surface of the second MOSFET element is placed on the second element placement part of the second output terminal. The light-receiving drive element is placed on the second surface of each of the first
(Continued)

MOSFET element and the second MOSFET element, and the second surface faces the first surface.

13 Claims, 20 Drawing Sheets

(58) Field of Classification Search
USPC .......................................................... 307/112
See application file for complete search history.

(56) References Cited

U.S. PATENT DOCUMENTS

| | | | | |
|---|---|---|---|---|
| 2015/0263184 | A1* | 9/2015 | Takai .................. | H10W 44/501<br>257/82 |
| 2021/0247567 | A1 | 8/2021 | Fujihara et al. | |
| 2023/0335666 | A1* | 10/2023 | Kitahara .............. | G02B 6/4201 |

FOREIGN PATENT DOCUMENTS

| | | | |
|---|---|---|---|
| JP | 6216418 | B2 | 10/2017 |
| JP | 2021-125670 | A | 8/2021 |

* cited by examiner

SEMICONDUCTOR RELAY AND ELECTRIC CIRCUIT COMPRISING SAME

This application is the U.S. National Phase under 35 U.S.C. § 371 of International Patent Application No. PCT/JP2022/034355, filed on Sep. 14, 2022, which in turn claims the benefit of Japanese Patent Application No. 2021-191714, filed on Nov. 26, 2021, the entire disclosures of which Applications are incorporated by reference herein.

TECHNICAL FIELD

The present disclosure relates to a semiconductor relay and an electric circuit including the same.

BACKGROUND ART

Conventionally, a semiconductor relay also called a MOSFET output photocoupler or an optical MOSFET is known as a means for transmitting AC signals (see, for example, PTL 1). In such a semiconductor relay, an increase in insertion loss has been a problem as transmission signals have a higher frequency.

To solve this problem, a configuration described in PTL 2 has been proposed, for example. In the semiconductor relay disclosed in PTL 2, a light emitting element placed on an input terminal and a light receiving element placed on an output terminal are disposed to face each other inside a sealing resin. Both the input terminal and the output terminal are bent once in the middle, and tip portions thereof protrude from the sealing resin toward the outside along the lower surface of the sealing resin.

In a case where the semiconductor relay is mounted on a circuit board having a signal line and a ground line formed on an upper surface thereof, a passing point on an output side of a signal is disposed above the signal line inside the semiconductor relay. This allows the distance between the passing point of signals and the ground line to decrease and insertion loss to be reduced by suppressing impedance mismatch.

In addition, it is possible to increase the distance between the light receiving element and the element placement part of the input terminal on which the light receiving element is placed and the ground line or the ground plane formed on the lower surface of the circuit board. Both the ground line and the ground plane are electrically connected to a ground potential. As a result, the capacitance value of the parasitic capacitance generated between the input side of the semiconductor relay and the ground potential can be reduced, and the insertion loss can be further reduced.

CITATION LIST

Patent Literature

PTL 1: Japanese Patent No. 6216418 B2
PTL 2: Japanese Patent No. 5491894 B2

SUMMARY OF THE INVENTION

In recent years, further downsizing of semiconductor relays has been required. In addition, it is required to further increase the frequency of a transmission signal transmitted via a semiconductor relay, and accordingly, it is required to further reduce insertion loss.

The present disclosure has been made in view of such a point, and an object of the present disclosure is to provide a semiconductor relay capable of reducing the size and the insertion loss, and an electric circuit including the semiconductor relay.

To achieve the above-described object, a semiconductor relay according to the present disclosure is a semiconductor relay mounted on a circuit board, including a first input terminal, a second input terminal, a light emitting element electrically connected to the first input terminal and the second input terminal, a light receiving element that receives light emitted from the light emitting element, a light-receiving drive element that includes the light receiving element and outputs a drive signal, a first MOSFET element that is turned on and off by the drive signal output from the light-receiving drive element, a second MOSFET element that is turned on and off by the drive signal output from the light-receiving drive element, a first output terminal including a first element placement part and a first output-side external terminal part, a second output terminal including a second element placement part and a second output-side external terminal part, and a sealing resin that seals the light emitting element, the light-receiving drive element, the first MOSFET element, the second MOSFET element, the first input terminal, the second input terminal, the first output terminal, and the second output terminal. The light emitting element and the light receiving element face each other at a predetermined interval, each of the first MOSFET element and the second MOSFET element includes a first surface and a second surface facing the first surface, a direction in which the light receiving element and the light emitting element face each other is a same direction as a direction in which the first surface and the second surface face each other, the first surface of the first MOSFET element is placed on the first element placement part, the first surface of the second MOSFET element is placed on the second element placement part, the first element placement part extends in an up-down direction, the first output-side external terminal part extends from the first element placement part along a lower surface of the sealing resin and protrudes from the sealing resin, and the light-receiving drive element is placed on the second surface of the first MOSFET element and the second surface of the second MOSFET element.

An electric circuit according to the present disclosure is an electric circuit including the semiconductor relay according to the present disclosure and the circuit board, wherein the circuit board includes a first wiring and a second wiring formed on an upper surface of a dielectric substrate, the first wiring is formed of a pair of wirings provided at an interval, the second wiring is formed of a pair of wirings provided at an interval, the first input terminal is connected to the first wiring, and a lower surface of the first input-side external terminal part is in contact with an upper surface of one of the pair of wirings forming the first wiring, the second input terminal is connected to the first wiring, and a lower surface of the second input-side external terminal part is in contact with an upper surface of the other of the pair of wirings forming the first wiring, the first output terminal is connected to the second wiring, and a lower surface of the first output-side external terminal part is in contact with an upper surface of one of the pair of wirings forming the second wiring, and the second output terminal is connected to the second wiring, and a lower surface of the first output-side external terminal part is in contact with an upper surface of the other of the pair of wirings forming the second wiring.

According to the present disclosure, the semiconductor relay can be downsized. In addition, insertion loss can be reduced.

DESCRIPTION OF EMBODIMENT

Hereinafter, exemplary embodiments of the present disclosure will be described with reference to the drawings. The description below of preferred exemplary embodiments is merely exemplary in nature, and is not intended to limit the present disclosure, its application, or its use. "MOS" means "Metal-Oxide Semiconductor Field Effect Transistor".

Exemplary Embodiment

Configuration of Semiconductor Relay

Figure 1:
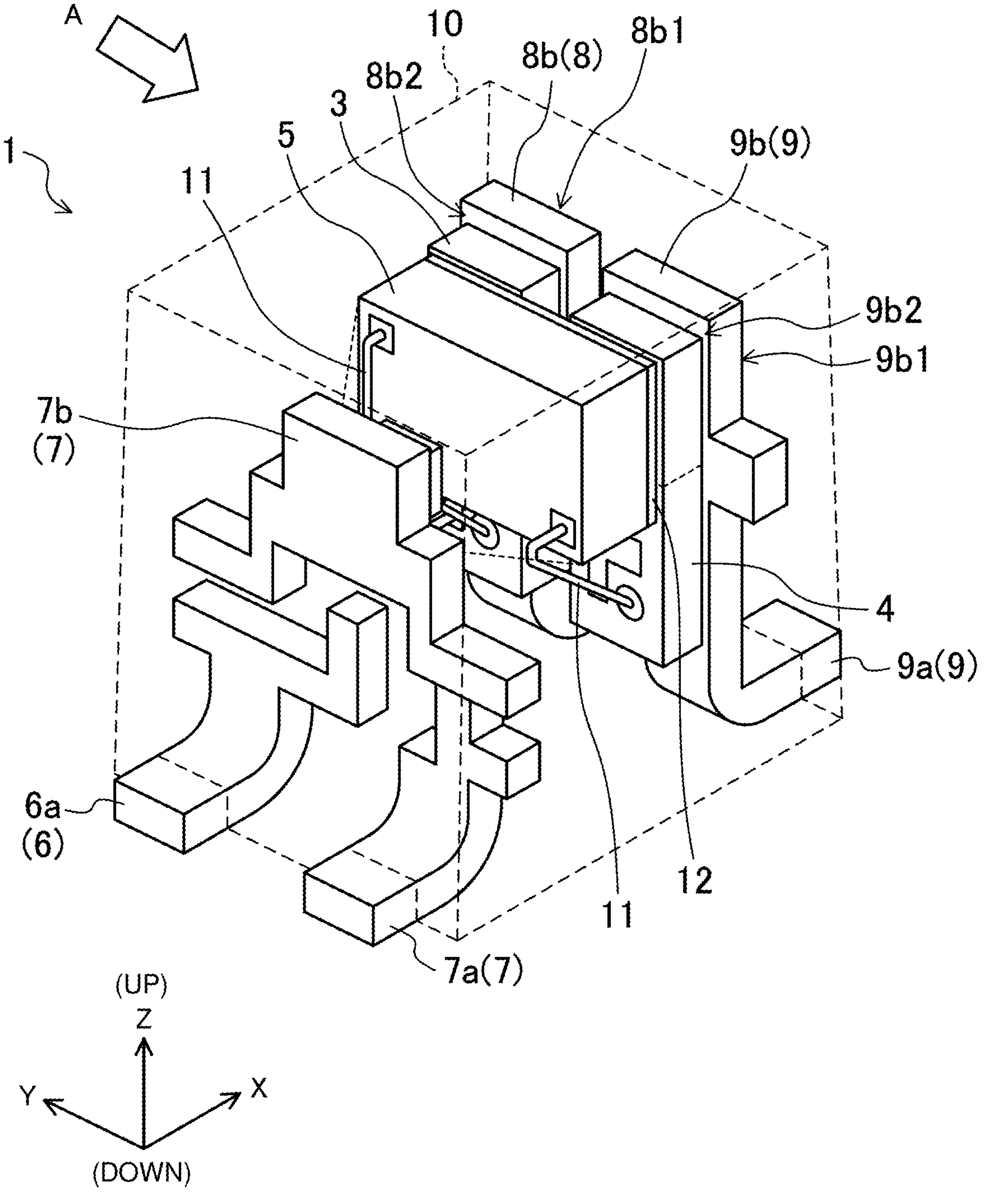
FIG. 1 is a perspective view of a semiconductor relay according to an exemplary embodiment.
Figure 2:
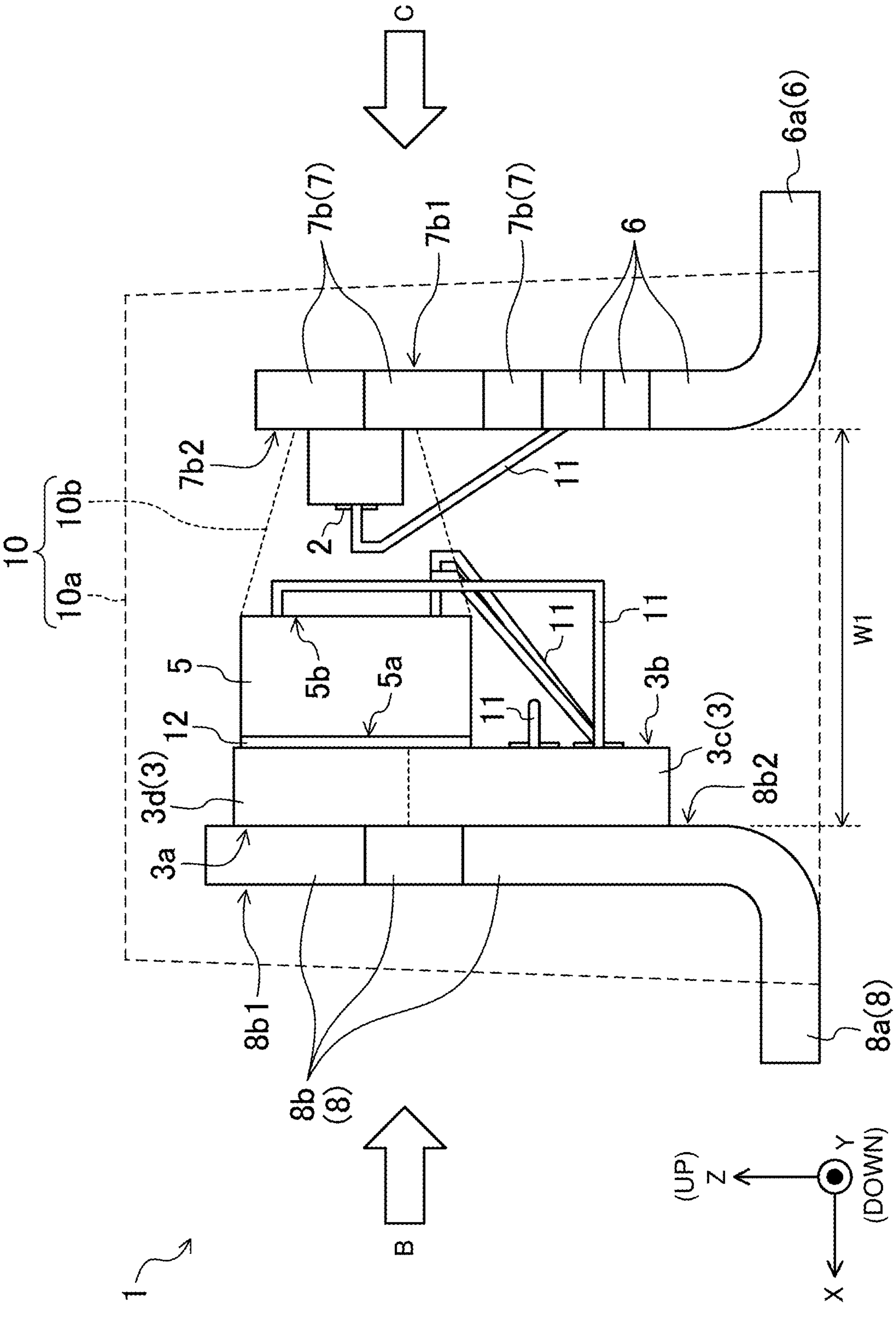
FIG. 2 is a side view of the semiconductor relay as viewed from direction A illustrated in FIG. 1.
Figure 3:
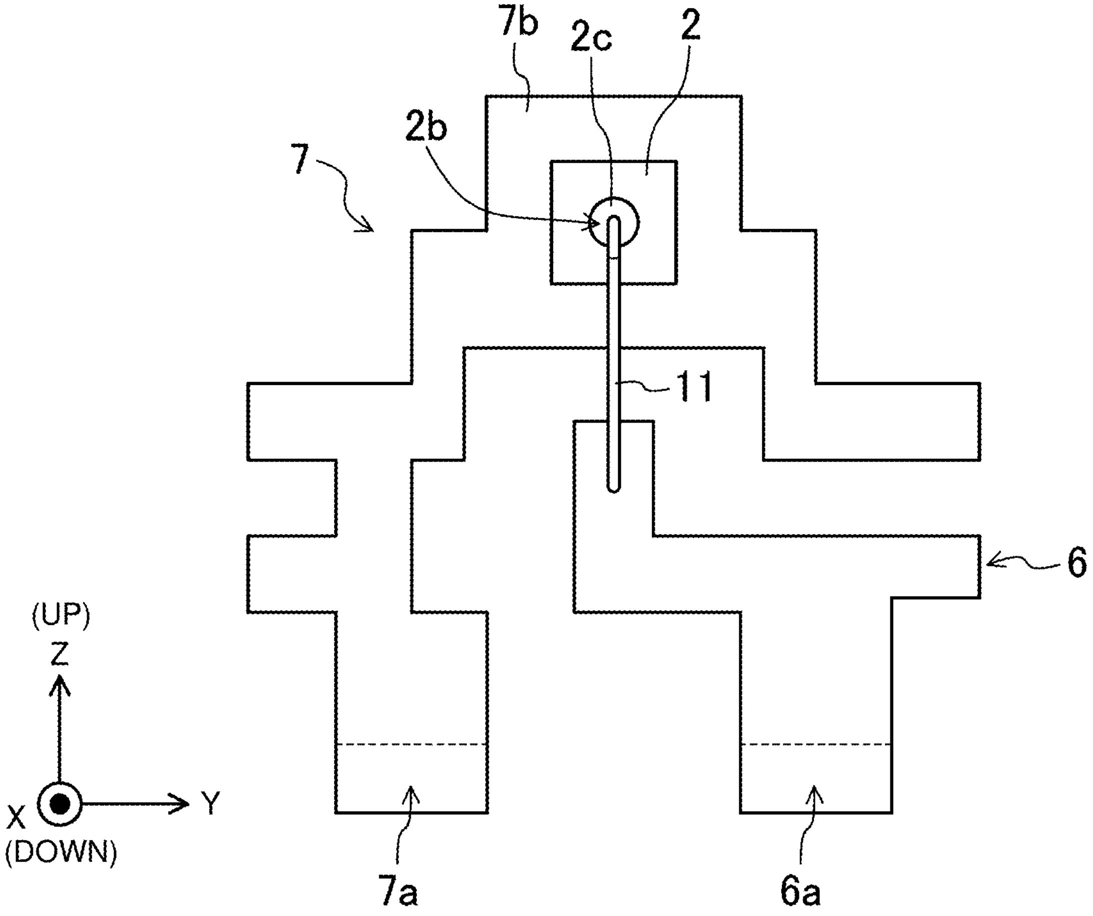
FIG. 3 is a view of a first input terminal and a second input terminal on which a light emitting element is placed as viewed from direction B illustrated in FIG. 2.
Figure 4:
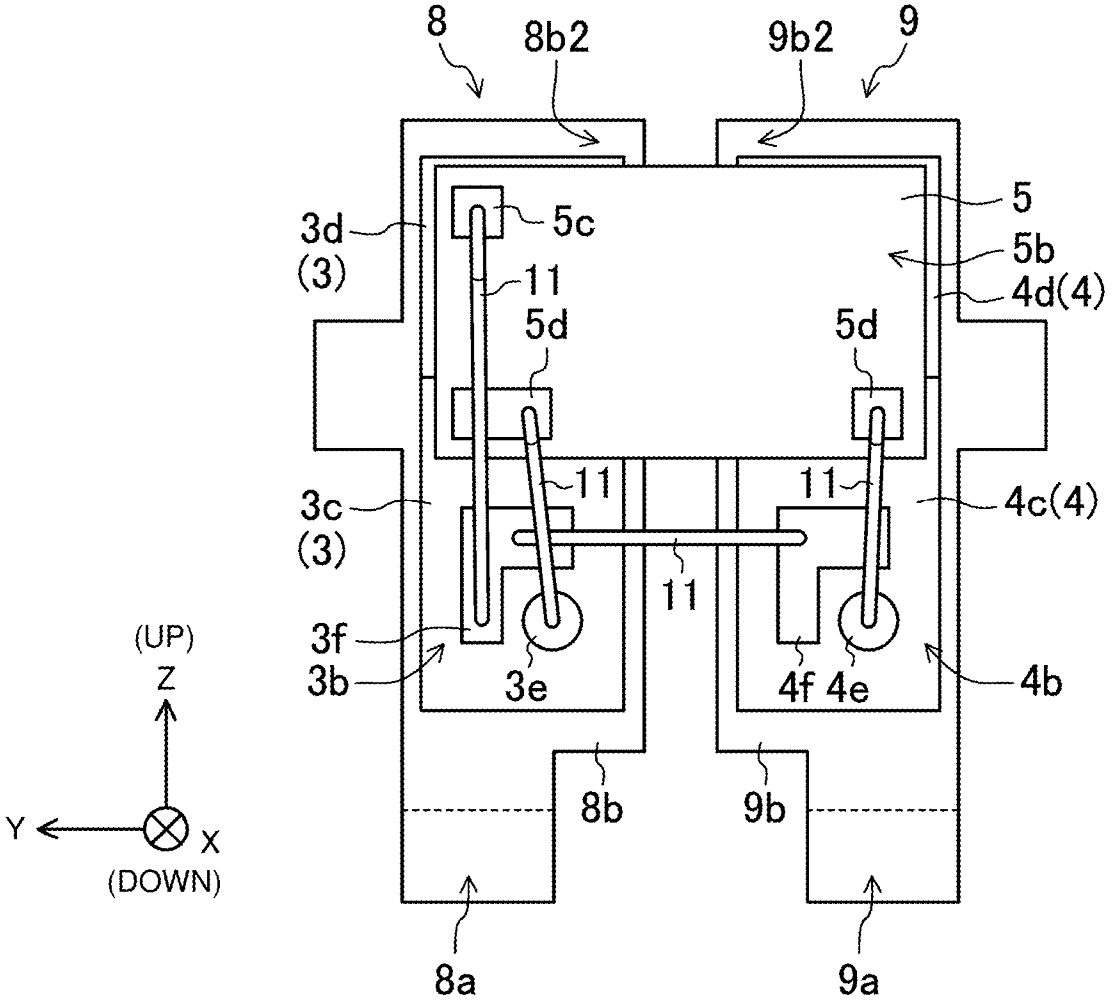
FIG. 4 is a view of a first output terminal and a second output terminal on which a light-receiving drive element, a first MOSFET element, and a second MOSFET element are placed as viewed from direction C illustrated in FIG. 2.

FIG. 1 is a perspective view of semiconductor relay 1 according to the present exemplary embodiment, and FIG. 2 is a side view of semiconductor relay 1 as viewed from direction A illustrated in FIG. 1. FIG. 3 is a view of first input terminal 6 and second input terminal 7 on which light emitting element 2 is placed as viewed from direction B illustrated in FIG. 2. FIG. 4 is a view of first output terminal 8 and second output terminal 9 on which light-receiving drive element 5, first MOSFET element 3, and second MOSFET element 4 are placed as viewed from direction C illustrated in FIG. 2. For convenience of description, in FIGS. 1 and 2, outlines of sealing resin 10 and light-shielding resin 10*a* and light-transmitting resin 10*b* constituting the sealing resin are indicated by broken lines.

Figure 5:
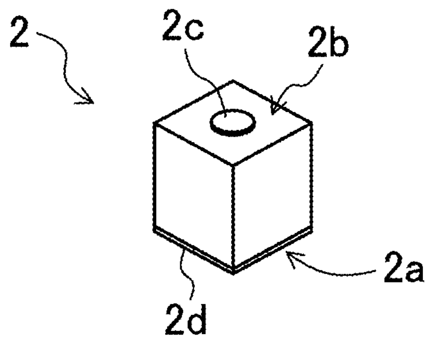
FIG. 5 is a perspective view of the light emitting element.
Figure 6:
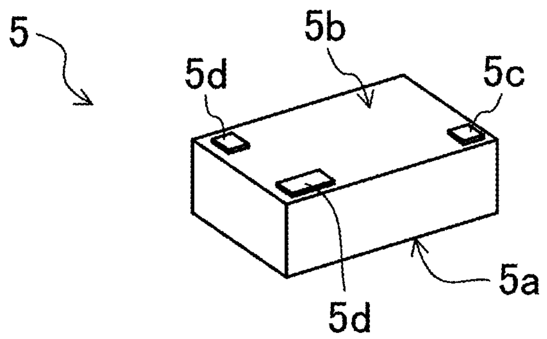
FIG. 6 is a perspective view of the light-receiving drive element.
Figure 7:
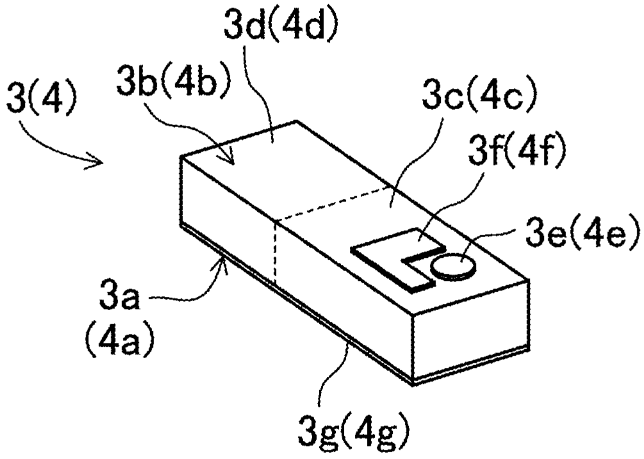
FIG. 7 is a perspective view of the first MOSFET element.

FIG. 5 is a perspective view of light emitting element 2, FIG. 6 is a perspective view of light-receiving drive element 5, and FIG. 7 is a perspective view of first MOSFET element 3.

In the following description, a direction in which light emitting element 2 and light-receiving drive element 5 face each other may be referred to as an X direction or a first direction. An array direction of first output terminal 8 and second output terminal 9 may be referred to as a Y direction or a second direction. The Y direction (second direction) is also an array direction of first input terminal 6 and second input terminal 7. An array direction of first element placement part 8*b* and first output-side external terminal part 8*a* may be referred to as a Z direction or a third direction. The Z direction (third direction) is also an array direction of second element placement part 9*b* and second output-side external terminal part 9*a*. In the Z direction (third direction), the side on which first element placement part 8*b* is disposed may be referred to as up or above, and the side on which first output-side external terminal part 8*a* is disposed may be referred to as down or below. The terms "above" and "below" in the present specification are merely relative, and do not mean, for example, "above" or "below" along a vertical direction.

The X direction (first direction), the Y direction (second direction), and the Z direction (third direction) are orthogonal to each other. In the present specification, "orthogonal" means orthogonal including machining tolerance and manufacturing tolerance of each component constituting semiconductor relay 1 and assembly tolerance between components, and does not mean that comparison targets are orthogonal in a strict sense.

As illustrated in FIGS. 1 and 2, semiconductor relay 1 includes light emitting element 2, light-receiving drive element 5, first MOSFET element 3, and second MOSFET element 4. Semiconductor relay 1 also includes first input terminal 6, second input terminal 7, first output terminal 8, second output terminal 9, and sealing resin 10.

Light emitting element 2 is a known light emitting diode (LED) element. As illustrated in FIG. 5, anode terminal 2*c* is formed on second surface 2*b* of light emitting element 2, and cathode terminal 2*d* is formed on first surface 2*a*. Cathode terminal 2*d* is connected and fixed to second surface 7*b*2 of element placement part 7*b* of second input terminal 7 via a conductive adhesive (not illustrated) such as silver paste. That is, cathode terminal 2*d* is electrically connected to second input terminal 7. As illustrated in FIG. 3, anode terminal 2*c* and first input terminal 6 are electrically connected via wire 11.

In the present specification, the "second surface" of each component is located closer to the center of semiconductor relay 1 along the X direction than the "first surface" in the state of being disposed inside semiconductor relay 1. In the state of being disposed inside semiconductor relay 1, the normal direction of each of the "first surface" and the "second surface" is in the X direction.

Figure 9:
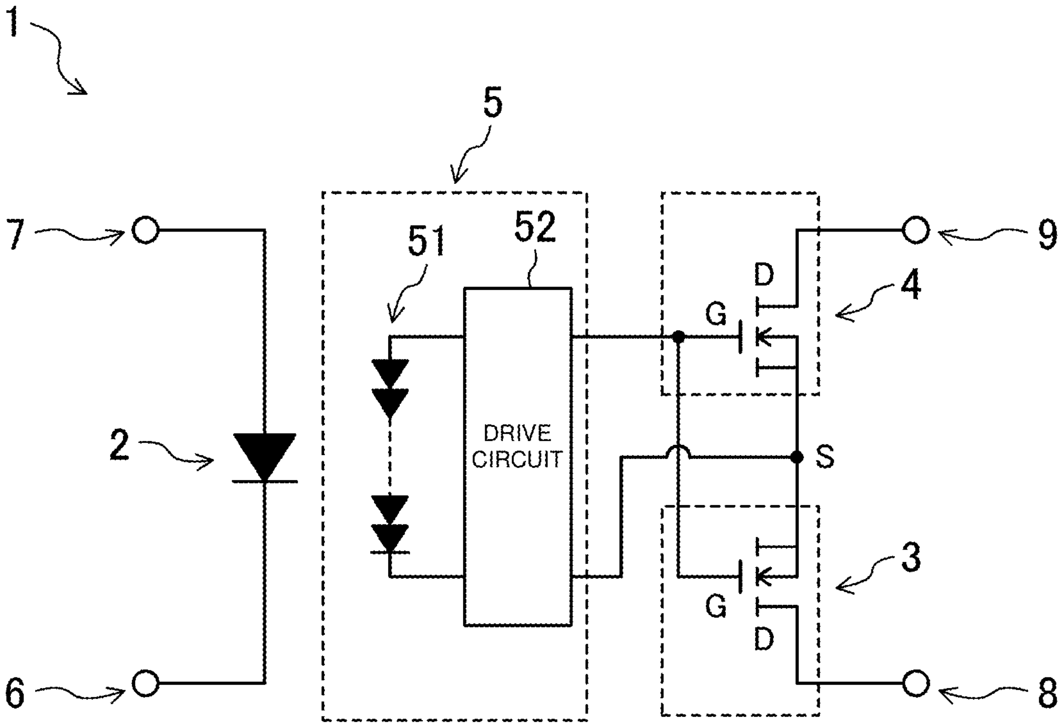
FIG. 9 is an equivalent circuit diagram of a semiconductor relay.

Light-receiving drive element 5 includes light receiving element 51 and drive circuit 52 (see FIG. 9). Light receiving element 51 is formed by, for example, disposing known photodiodes in an array. As illustrated in FIG. 6, source terminal 5*c* and drain terminal 5*d* are formed on second surface 5*b* of light-receiving drive element 5. The drain terminals 5*d* are provided at two positions separated from each other on second surface 5*b*. Although light receiving element 51 is also formed on second surface 5*b* of light-receiving drive element 5, illustration of the light receiving element is omitted for convenience of description.

As illustrated in FIG. 4, source terminal 5*c* of light-receiving drive element 5 and first source terminal 3*f* of first MOSFET element 3 are electrically connected via wire 11. One of two drain terminals 5*d* of light-receiving drive element 5 is electrically connected to first gate terminal 3*e* of first MOSFET element 3 via wire 11. The other of two drain terminals 5*d* is electrically connected to second gate terminal 4*e* of second MOSFET element 4 via wire 11.

First MOSFET element 3 is formed by forming a known vertical MOSFET on a semiconductor substrate. First MOSFET element 3 is usually formed of a plurality of vertical MOSFETs connected in series or in parallel. However, a single vertical MOSFET may be used. As illustrated in FIG. 7, first gate terminal 3*e* and first source terminal 3*f* are formed on second surface 3*b* of first MOSFET element 3, and first drain terminal 3*g* is formed on first surface 3*a*. First drain terminal 3*g* is formed over substantially entire first surface 3*a* of first MOSFET element 3.

First MOSFET element 3 has element formation region 3*c* and element non-formation region 3*d* adjacent to the element formation region.

As illustrated in FIG. 7, second MOSFET element 4 has the same structure as first MOSFET element 3. Thus, the disposition and shapes of second gate terminal 4*e*, second source terminal 4*f*, and second drain terminal 4*g* are the same as those in first MOSFET element 3. Second MOSFET element 4 has element formation region 4*c* and element non-formation region 4*d* adjacent to the element formation region in the same manner as in first MOSFET element 3.

In the following description, element formation region 3*c* is referred to as first region 3*c*, element formation region 4*c* is referred to as first region 4*c*, element non-formation region 3*d* is referred to as second region 3*d*, and element non-formation region 4 is referred to as second region 4*d*. One or a plurality of vertical MOSFETs are formed in each of first regions 3*c*, 4*c*. On the other hand, no vertical MOSFET is formed in each of second regions 3*d*, 4*d*. In first MOSFET element 3, first surface 3*a* of first region 3*c* is continuous with first surface 3*a* of second region 3*d*, and the surfaces form the same plane. Second surface 3*b* of first region 3*c* is continuous with second surface 3*b* of second region 3*d*, and the surfaces form the same plane. In second MOSFET element 4, first surface 4*a* of first region 4*c* is continuous with first surface 4*a* of second region 4*d*, and the surfaces form the same plane. Second surface 4*b* of first region 4*c* is continuous with second surface 4*b* of second region 4*d*, and the surfaces form the same plane.

As illustrated in FIG. 4, first source terminal 3*f* of first MOSFET element 3 and second source terminal 4*f* of second MOSFET element 4 are electrically connected via wire 11. That is, first MOSFET element 3 is connected in anti-series with second MOSFET element 4. Wire 11 is located below light-receiving drive element 5 in the Z direction.

As illustrated in FIG. 1 or 2, the first drain terminal of first MOSFET element 3 is fixed to second surface 8*b*2 of first element placement part 8*b* of first output terminal 8 by a conductive adhesive (not illustrated) such as silver paste. The second drain terminal of second MOSFET element 4 is fixed to second surface 9*b*2 of second element placement part 9*b* of second output terminal 9 by a conductive adhesive.

As illustrated in FIG. 1 or 2, light-receiving drive element 5 is disposed and fixed across second surface 3*b* of second region 3*d* of first MOSFET element 3 and second surface 4*b* of second region 4*d* of second MOSFET element 4 via insulating adhesive 12. That is, first MOSFET element 3, insulating adhesive 12, and light-receiving drive element 5 are stacked in this order on second surface 8*b*2 of first element placement part 8*b* of first output terminal 8. Second MOSFET element 4, insulating adhesive 12, and light-receiving drive element 5 are stacked in this order on second surface 9*b*2 of second element placement part 9*b* of second output terminal 9. In the present exemplary embodiment, a die attachment film (DAF) is used as insulating adhesive 12.

Each of first input terminal 6 and second input terminal 7 is a conductive member obtained by processing a copper plate. Another metal film, for example, a metal film containing nickel (not illustrated) is plated on the surface of the copper plate. The material of the metal film is not particularly limited to this.

First input terminal 6 includes input-side external terminal part 6*a*, and second input terminal 7 includes input-side external terminal part 7*a*. The second input terminal includes element placement part 7*b*.

As illustrated in FIG. 1 or 2, each of first input terminal 6 and second input terminal 7 extends downward along the Z direction from one end located inside sealing resin 10 and is bent in the vicinity of the lower surface of sealing resin 10, and the other end extends along the Y direction from the side surface of sealing resin 10 and further protrudes from sealing resin 10 toward the outside. In first input terminal 6 and second input terminal 7, portions protruding from sealing resin 10 toward the outside are input-side external terminal part 6*a* and input-side external terminal part 7*a*, respectively.

Element placement part 7*b* is disposed inside sealing resin 10. Element placement part 7*b* has first surface 7*b*1 and second surface 7*b*2 facing first surface 7*b*1 in the X direction.

Light emitting element 2 is placed on second surface 7*b*2 of element placement part 7*b*. First input terminal 6 is disposed side by side with second input terminal 7 in the Y direction, and is separated from second input terminal 7.

Each of first output terminal 8 and second output terminal 9 is a conductive member obtained by processing a copper plate. Another metal film, for example, a metal film containing nickel (not illustrated) is plated on the surface of the copper plate. The material of the metal film is not particularly limited to this.

First output terminal 8 includes first output-side external terminal part 8*a* and first element placement part 8*b*. Second output terminal 9 includes second output-side external terminal part 9*a* and second element placement part 9*b*.

As illustrated in FIG. 1 or 2, each of first output terminal 8 and second output terminal 9 extends downward along the Z direction from one end located inside sealing resin 10 and is bent in the vicinity of the lower surface of sealing resin 10, and the other end extends along the Y direction from the side surface of sealing resin 10 and further protrudes from sealing resin 10 toward the outside. In first output terminal

8, a portion protruding from sealing resin 10 toward the outside is first output-side external terminal part 8*a*. In second output terminal 9, a portion protruding from sealing resin 10 toward the outside is second output-side external terminal part 9*a*.

First element placement part 8*b* and second element placement part 9*b* are disposed inside sealing resin 10, and have first surfaces 8*b*1, 9*b*1 and second surfaces 8*b*2, 9*b*2 facing first surfaces 8*b*1, 9*b*1 in the X direction, respectively. First MOSFET element 3 is placed on second surface 8*b*2 of first element placement part 8*b*. Second MOSFET element 4 is placed on second surface 9*b*2 of second element placement part 9*b*. First output terminal 8 is disposed side by side with second output terminal 9 in the Y direction, and is separated from second output terminal 9.

As illustrated in FIG. 1 or 2, first element placement part 8*b* and second element placement part 9*b* face element placement part 7*b* of second input terminal 7 in the X direction with distance W1. Distance W1 is a distance in the X direction between second surfaces 8*b*2, 9*b*2 of first element placement part 8*b* and second element placement part 9*b* and second surface 7*b*2 of element placement part 7*b* of second input terminal 7.

As illustrated in FIG. 1 or FIG. 2, as viewed from the Z direction, first output-side external terminal part 8*a* faces input-side external terminal part 6*a* of first input terminal 6 in the Y direction. Second output-side external terminal part 9*a* faces input-side external terminal part 7*a* of second input terminal 7 in the Y direction.

Sealing resin 10 seals first input terminal 6, second input terminal 7, first output terminal 8, and second output terminal 9, and fixes the respective positions. In addition, it goes without saying that light emitting element 2 placed on second input terminal 7, first MOSFET element 3 placed on first output terminal 8, second MOSFET element 4 placed on second output terminal 9, and light-receiving drive element 5 are sealed by sealing resin 10, and the respective positions are fixed. As described above, first output-side external terminal part 8*a*, second output-side external terminal part 9*a*, input-side external terminal part 6*a* of first input terminal 6, and input-side external terminal part 7*a* of second input terminal 7 protrude from sealing resin 10 toward the outside.

As illustrated in FIG. 1 or 2, each sealing resin 10 has insulating light-shielding resin 10*a* and a light-transmitting resin 10*b*. Light-shielding resin 10*a* is, for example, an epoxy resin containing a black pigment. The material is not particularly limited to this, and may be any material that shields light. Light-transmitting resin 10*b* is provided between light-receiving drive element 5 and light emitting element 2, and is sealed by light-shielding resin 10*a*. light-transmitting resin 10*b* is, for example, a transparent silicone resin. The light-transmitting resin is not particularly limited to this, and may be an insulating resin that is transparent to at least light emitted from light emitting element 2. Light-transmitting resin 10*b* constitutes an optical coupling part that optically couples light receiving element 51 and light emitting element 2 of light-receiving drive element 5.

As illustrated in FIGS. 1 and 2, the side surface of sealing resin 10 is formed to be inclined at a predetermined angle with respect to the Z direction. Specifically, the outer shape of sealing resin 10 has a forward tapered shape in which the width increases from the up to the down along the Z direction in sectional view. This is to easily pull out sealing resin 10 from a mold when the sealing resin is molded by a mold (not illustrated).

First input terminal 6 and second input terminal 7, and first output terminal 8 and second output terminal 9 are electrically insulated from each other by sealing resin 10. Light emitting element 2, light-receiving drive element 5, first MOSFET element 3, and second MOSFET element 4 are electrically insulated from each other by sealing resin 10. That is, semiconductor relay 1 is input-output insulation type semiconductor relay 1 that turns on and off an output signal in a state where an input signal and the output signal are electrically insulated.

Configuration of Electric Circuit

Figure 8:
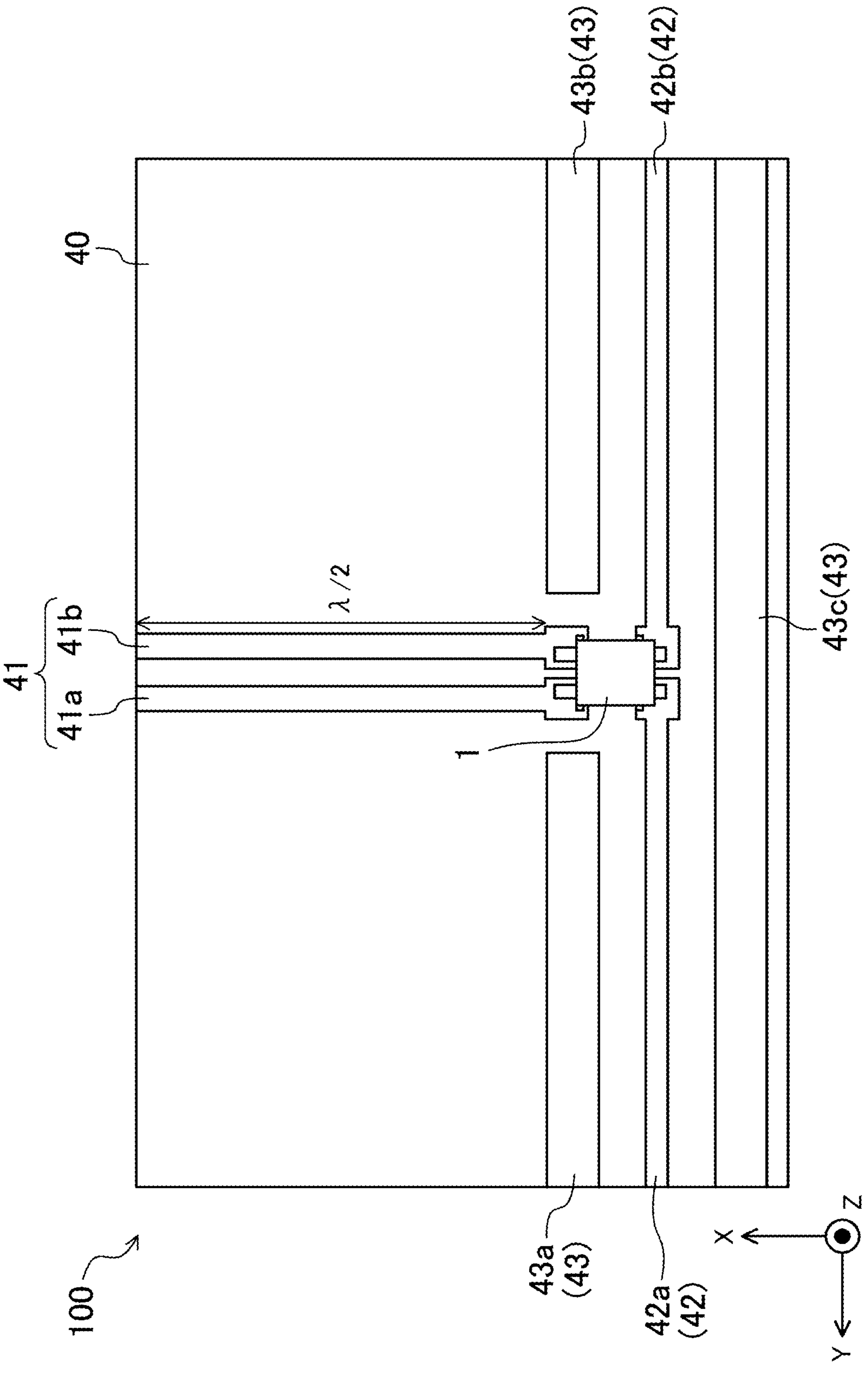
FIG. 8 is a schematic diagram of an electric circuit according to an exemplary embodiment.

FIG. 8 is a schematic diagram of an electric circuit according to an exemplary embodiment. Electric circuit 100 includes at least semiconductor relay 1 and circuit board 40. Circuit board 40 is a so-called printed wiring board in which first wiring 41, second wiring 42, and third wiring 43 are formed on an upper surface of dielectric substrate 40*a* made of a dielectric material having a predetermined relative dielectric constant. Ground plane 45 (see, for example, FIG. 13) is formed on the lower surface of circuit board 40. Ground plane 45 is formed over substantially the entire lower surface of dielectric substrate 40*a*. First wiring 41, second wiring 42, third wiring 43, and ground plane 45 are formed by applying copper plating or the like to the upper surface or the lower surface of dielectric substrate 40*a*.

Third wiring 43 and ground plane 45 are electrically connected via conductive via 44 (see, for example, FIG. 13) penetrating dielectric substrate 40*a* in a thickness direction, in this case, the Z direction. Ground plane 45 is electrically connected to the ground potential of electric circuit 100. To reduce the transmission loss of transmission signals, the relative dielectric constant of dielectric substrate 40*a* is set to be low.

First wiring 41 is formed of a pair of wirings 41*a*, 41*b* provided at an interval in the Y direction and parallel to each other whose longitudinal direction are in the X direction. First wiring 41 is an input signal line for inputting a transmission signal to semiconductor relay 1. One end of each of the pair of wires 41*a*, 41*b* constituting first wiring 41 is connected to input-side external terminal parts 6*a*, 7*a* of first input terminal 6 and second input terminal 7. Specifically, input-side external terminal parts 6*a*, 7*a* of first input terminal 6 and second input terminal 7 are connected to the first wiring such that the lower surfaces thereof are in contact with the upper surfaces of the pair of wirings 41*a*, 41*b* constituting first wiring 41. On the other hand, as illustrated in FIG. 8, the other end of each of the pair of wirings 41*a*, 41*b* constituting first wiring 41 is an open end. The length of each of the pair of wires 41*a*, 41*b* in the X direction is set to 1/2 (=$\lambda/2$) of wavelength $\lambda$ of the transmission signal.

Second wiring 42 is formed of a pair of wirings 42*a*, 42*b* provided at an interval in the Y direction whose longitudinal directions are in the Y direction. Second wiring 42 is an output signal line of a transmission signal output from semiconductor relay 1. One end of each of the pair of wires 42*a*, 42*b* constituting second wiring 42 is connected to first output-side external terminal part 8*a* of first output terminal 8 and second output-side external terminal part 9*a* of second output terminal 9. Specifically, first output-side external terminal part 8*a* of first output terminal 8 and second output-side external terminal part 9*a* of second output terminal 9 are connected to second wiring 42 such that lower surfaces thereof are in contact with upper surfaces of the pair of wirings 42*a*, 42*b* constituting second wiring 42.

Third wiring 43 includes two wirings 43*a*, 43*b* provided so as to sandwich the end portions of the pair of wirings 41*a*, 41*b* constituting first wiring 41, and wiring 43*c* provided on the opposite side in the X direction across two wirings 43*a*, 43*b* and second wiring 42. The longitudinal direction of each of three wirings 43*a*, 43*b*, 43*c* is in the Y direction. As described above, three wirings 43*a*, 43*b*, 43*c* included in third wiring 43 are also electrically connected to the ground potential via ground plane 45. That is, third wiring 43 is provided to be separated from second wiring 42 which is an output signal line and to sandwich second wiring 42, and serves to shield radiation noise or the like incident on second wiring 42.

Although FIG. 8 illustrates an example in which only semiconductor relay 1 is mounted on circuit board 40, it goes without saying that other elements may be mounted on circuit board 40.

Operation of Semiconductor Relay

FIG. 9 illustrates an equivalent circuit diagram of semiconductor relay 1.

When a transmission signal is input between first input terminal 6 and second input terminal 7, light emitting element 2 outputs light having a predetermined wavelength. The light generated in light emitting element 2 propagates through light-transmitting resin 10*b* and is received by light receiving element 51.

In light receiving element 51, a current is generated by photoelectric conversion, and drive circuit 52 operates based on the current. A drive signal that is a voltage signal corresponding to the light quantity of light emitting element 2 is applied to each of first gate terminal 3*e* of first MOSFET element 3 and second gate terminal 4*e* of second MOSFET element 4 via wire 11.

When the voltage of the drive signal exceeds a threshold voltage of each of first MOSFET element 3 and second MOSFET element 4, the source(S)-drain (D) of first MOSFET element 3 and the source(S)-drain (D) of second MOSFET element 4 are turned on. Further, first output terminal 8 and second output terminal 9 are brought into conduction via first MOSFET element 3 and second MOSFET element 4. This causes a transmission signal input between first input terminal 6 and second input terminal 7 to be transmitted between first output terminal 8 and second output terminal 9 and further transmitted to second wiring 42.

When the input of the transmission signal stops between first input terminal 6 and second input terminal 7, light emission from light emitting element 2 also stops. In response to this, no current is generated in light receiving element 51, and drive circuit 52 stops.

As a result, the voltage of the drive signal applied to each of first gate terminal 3*e* of first MOSFET element 3 and second gate terminal 4*e* of second MOSFET element 4 decreases. When the voltage of the drive signal falls below the above-described threshold voltage, the source(S)-drain (D) of first MOSFET element 3 and the source(S)-drain (D) of second MOSFET element 4 are turned off. Further, first output terminal 8 and second output terminal 9 are brought into a non-conductive state. This causes the transmission signal input between first input terminal 6 and second input terminal 7 to be blocked by semiconductor relay 1 so as not to be transmitted to second wiring 42.

Effects and the Like

As described above, semiconductor relay 1 according to the present exemplary embodiment includes at least first input terminal 6 and second input terminal 7, and light emitting element 2 electrically connected to first input terminal 6 and second input terminal 7. Semiconductor relay 1 also includes light-receiving drive element 5 that outputs a drive signal to each of first MOSFET element 3 and second MOSFET element 4. Light-receiving drive element 5 includes light receiving element 51 that receives the light emitted from light emitting element 2, and drive circuit 52 that operates with the current generated in light receiving element 51 and outputs the drive signal described above.

Semiconductor relay 1 further includes first MOSFET element 3 and second MOSFET element 4 that are turned on and off by the drive signal output from drive circuit 52. Semiconductor relay 1 also includes first output terminal 8 having first element placement part 8*b* and first output-side external terminal part 8*a*, and second output terminal 9 having second element placement part 9*b* and second output-side external terminal part 9*a*.

Semiconductor relay 1 further includes sealing resin 10 that seals light emitting element 2, light-receiving drive element 5, first MOSFET element 3, second MOSFET element 4, first input terminal 6, second input terminal 7, first output terminal 8, and second output terminal 9.

Light emitting element 2 and light receiving element 51 face each other in the X direction (first direction) at a predetermined interval. First MOSFET element 3 and second MOSFET element 4 include first surfaces 3*a*, 4*a*, and second surfaces 3*b*,4*b* facing first surfaces 3*a*, 4*a* in the X direction, respectively. First surface 3*a* of first MOSFET element 3 is placed on first element placement part 8*b* of first output terminal 8. First surface 4*a* of second MOSFET element 4 is placed on second element placement part 9*b* of second output terminal 9.

An array direction of first element placement part 8*b* and first output-side external terminal part 8*a* of first output terminal 8 is in the Z direction (third direction), and a direction orthogonal to the X direction and the Z direction is in the Y direction (second direction). First element placement part 8*b* is disposed above first output-side external terminal part 8*a* along the Z direction. In second output terminal 9, second element placement part 9*b* is disposed above second output-side external terminal part 9*a* along the Z direction. Light-receiving drive element 5 is placed on second surfaces 3*b*, 4*b* of first MOSFET element 3 and second MOSFET element 4. Specifically, light-receiving drive element 5 is placed on second surfaces 3*b*, 4*b* in second regions 3*d*, 4*d* of first MOSFET element 3 and second MOSFET element 4.

Configuring semiconductor relay 1 in this manner makes it possible to downsize semiconductor relay 1. In addition, insertion loss can be reduced. These will be further described in comparison with the conventional configuration disclosed in PTL 2.

Figure 10:
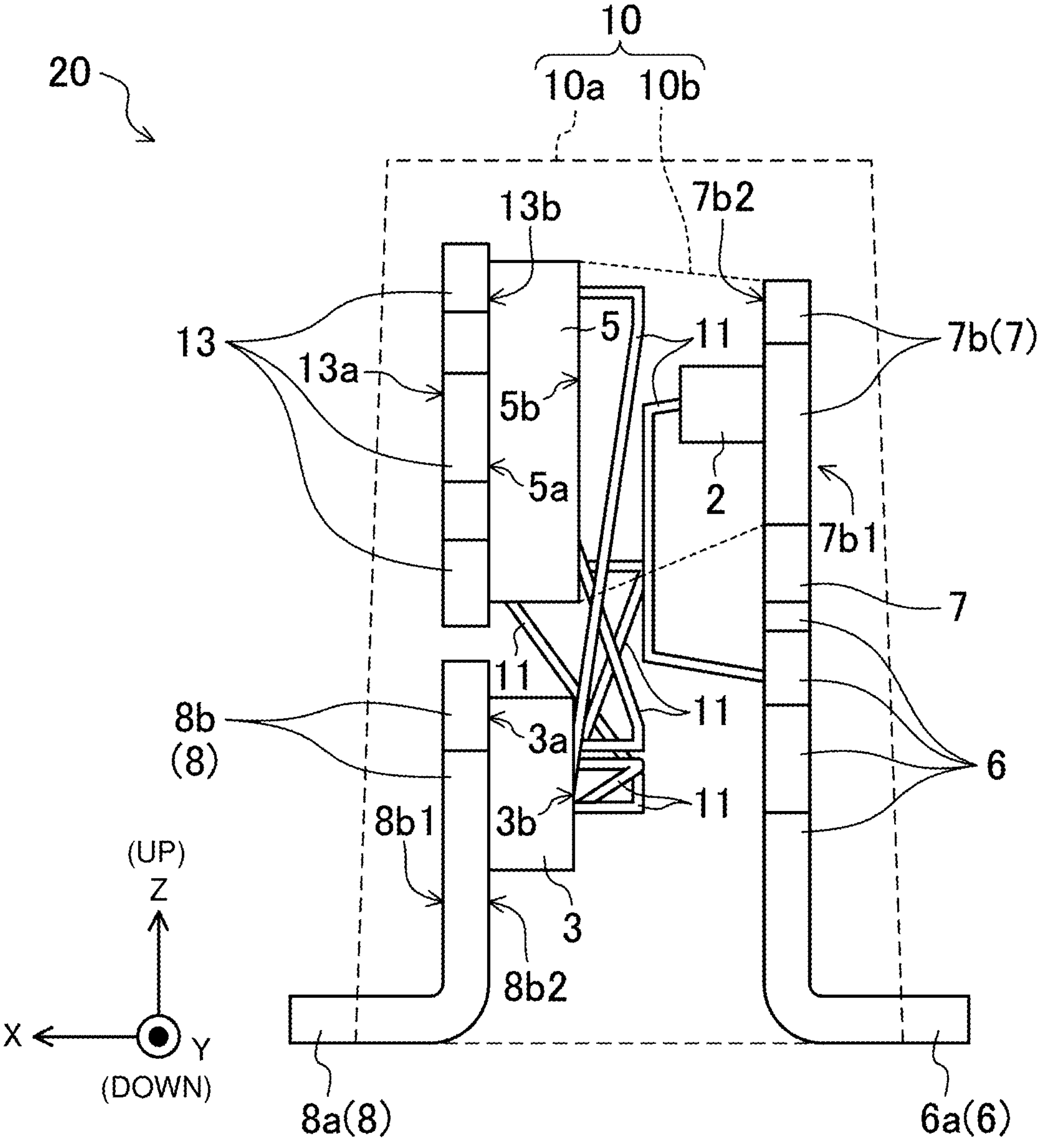
FIG. 10 is a view of a semiconductor relay according to a comparative example corresponding to FIG. 2.
Figure 11:
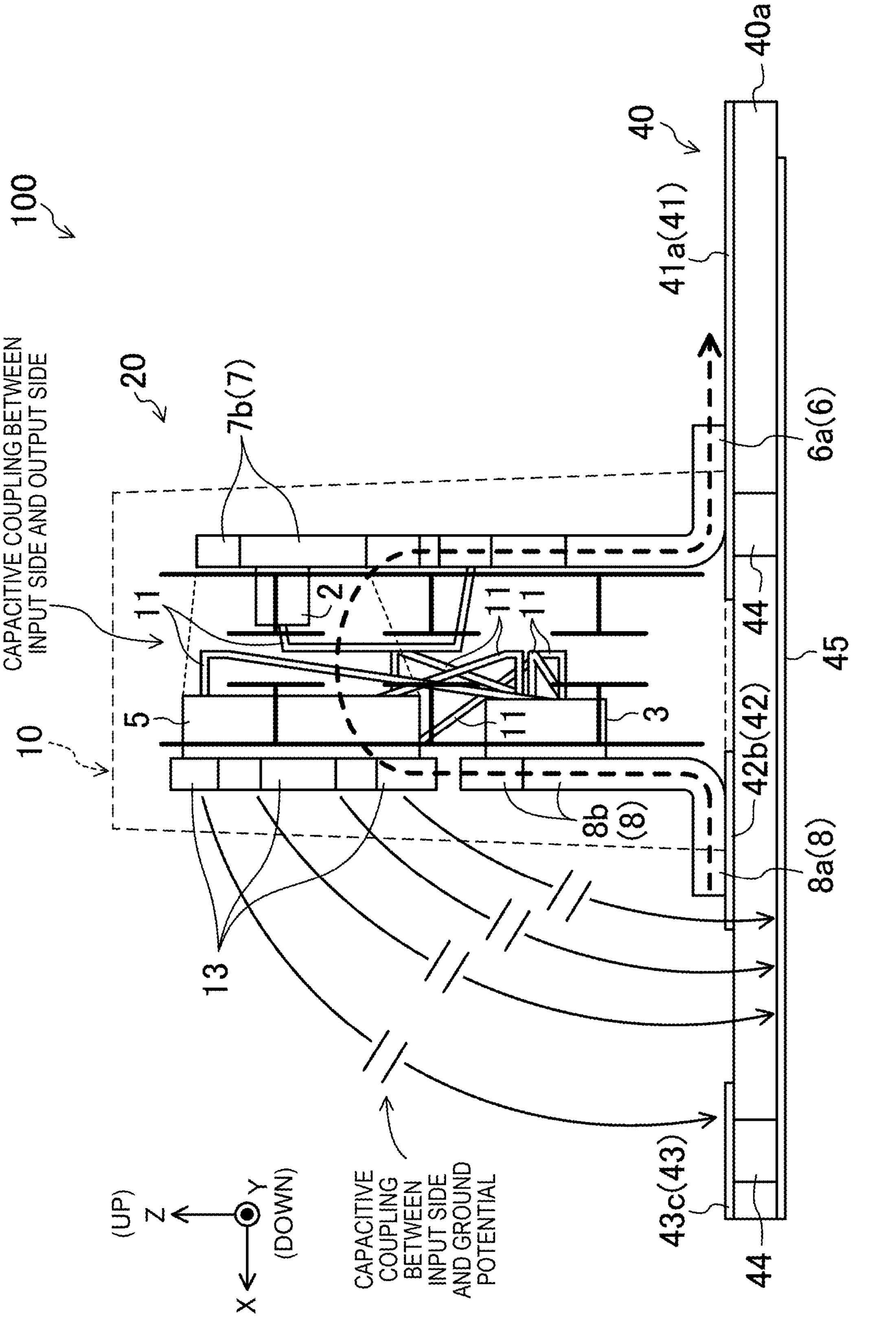
FIG. 11 is a schematic diagram illustrating a distribution of parasitic capacitances in the semiconductor relay according to the comparative example.

FIG. 10 is a view of a semiconductor relay according to a comparative example corresponding to FIG. 2, and FIG. 11 schematically illustrates a distribution of parasitic capacitances in the semiconductor relay according to the comparative example. Specifically, FIGS. 10 and 11 illustrate conventional semiconductor relay 20 disclosed in PTL 2. In FIGS. 10 to 16, portions similar to those illustrated in FIGS. 1 to 8 are denoted by the same reference numerals, and detailed description thereof may be omitted.

Conventional semiconductor relay 20 illustrated in FIG. 10 is different from semiconductor relay 1 of the present exemplary embodiment in the following points. First, third element placement part 13 is provided above first output terminal 8 and second output terminal 9 along the Z direction and is separated from first output terminal 8 and second output terminal 9. Next, light-receiving drive element 5 is placed on second surface 13*b* of third element placement part 13. That is, light-receiving drive element 5 is disposed above first MOSFET element 3 and second MOSFET element 4 along the Z direction and is separated from first MOSFET element 3 and second MOSFET element 4.

As a result, as illustrated in FIG. 11, in semiconductor relay 20, a parasitic capacitance is generated by capacitive coupling between the ground potential and third element placement part 13. In addition, parasitic capacitances due to capacitive coupling are generated between first output terminal 8 and second output terminal 9 and between third element placement part 13 and first input terminal 6 and second input terminal 7 located on the output side. Due to these parasitic capacitances, insertion loss occurs when a signal is transmitted from first input terminal 6 and second input terminal 7 to first output terminal 8 and second output terminal 9. In addition, the degree of increase in insertion loss increases as the signal becomes higher in frequency.

On the other hand, in semiconductor relay 1 of the present exemplary embodiment, third element placement part 13 illustrated in FIG. 10 is omitted, and light-receiving drive element 5 is placed on second surfaces 3*b*, 4*b* of second regions 3*d*, 4*d* of first MOSFET element 3 and second MOSFET element 4 as illustrated in FIGS. 1 and 2. This makes it possible to reduce both capacitance coupling with the ground potential and capacitive coupling between the input side and the output side.

Figure 12:
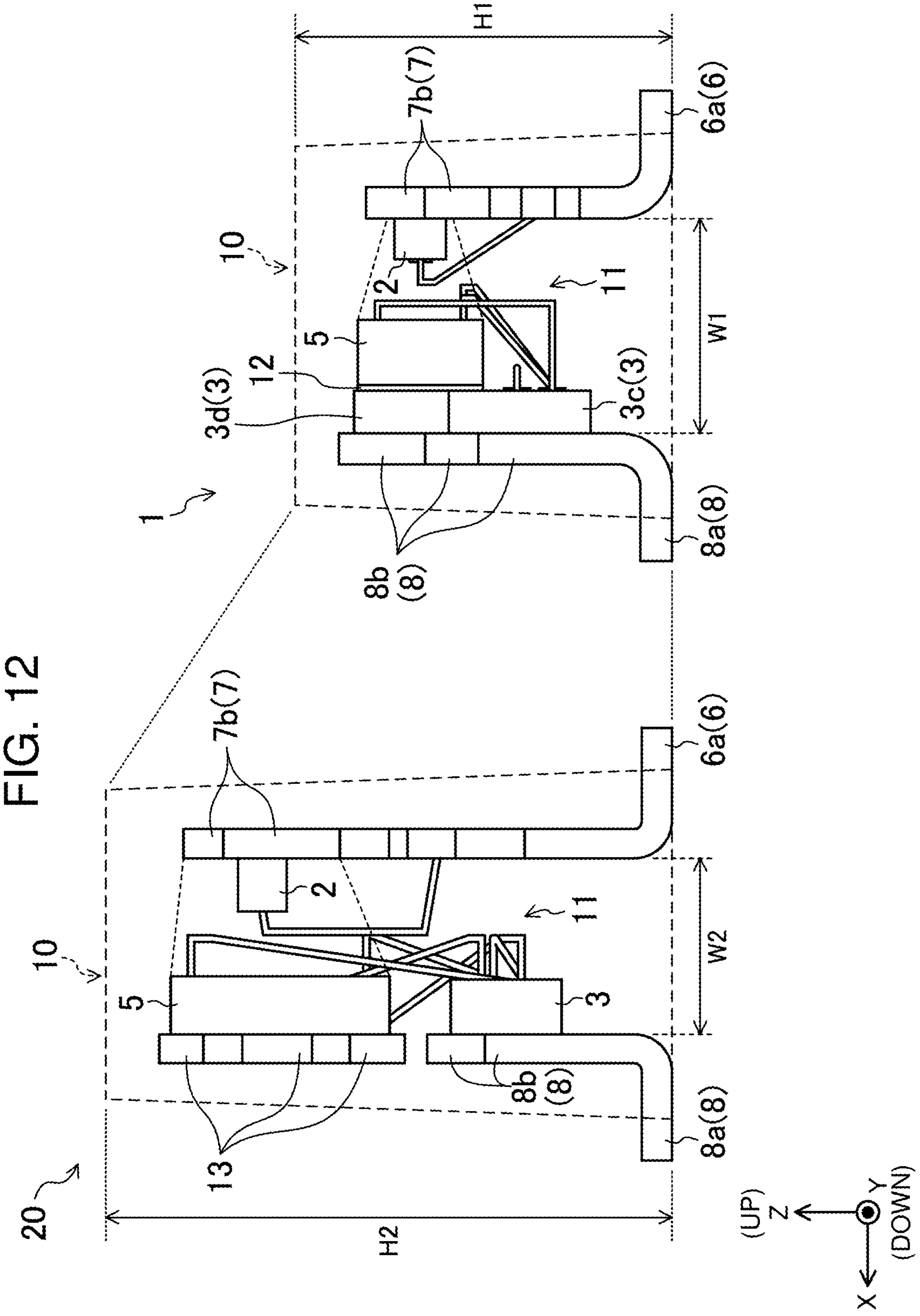
FIG. 12 is a schematic diagram for describing an effect of reducing capacitive coupling between an input side and an output side.
Figure 13:
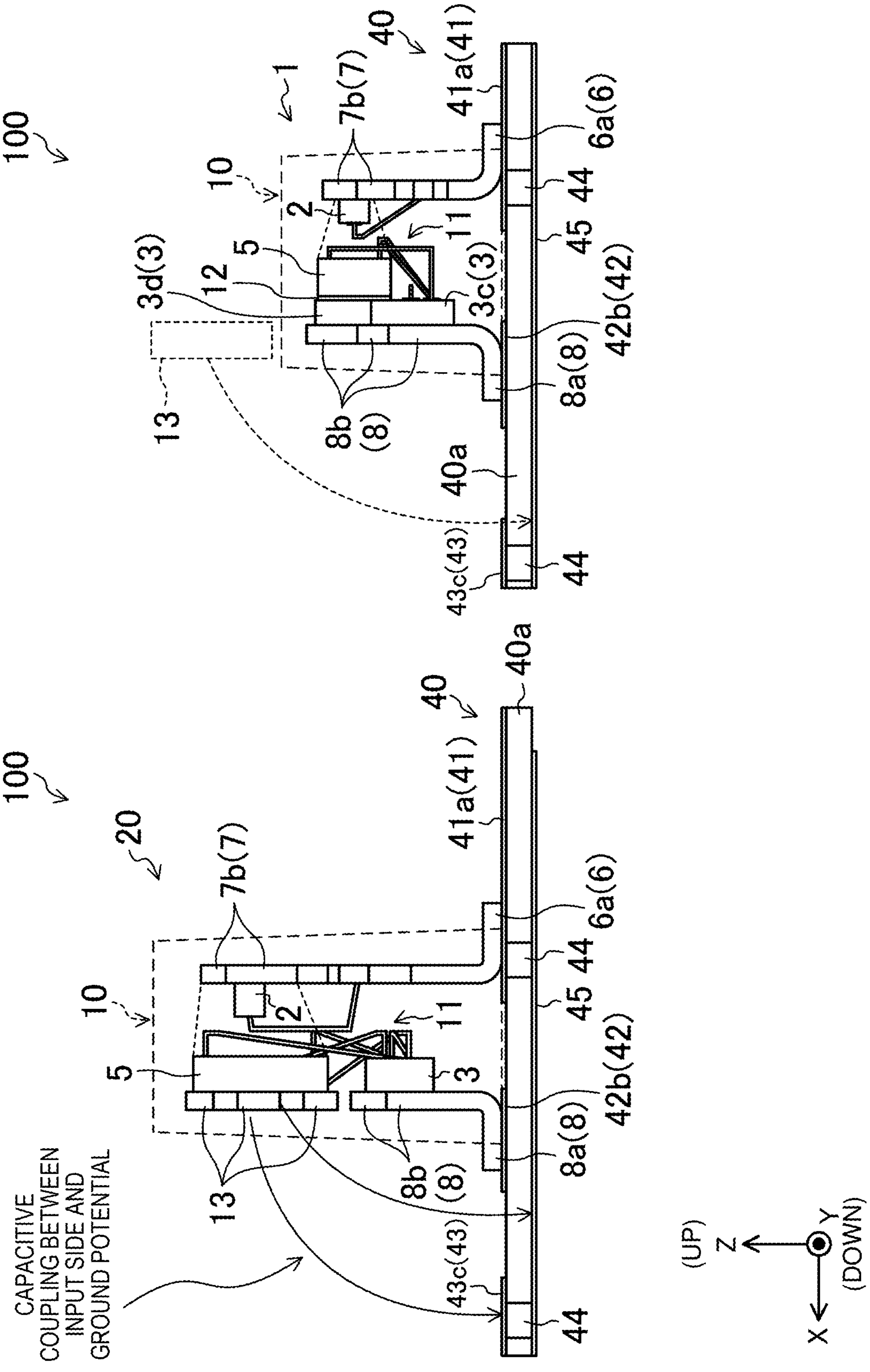
FIG. 13 is a schematic diagram for describing an effect of reducing capacitive coupling with a ground potential.

FIG. 12 is a schematic diagram for describing an effect of reducing capacitive coupling between the input side and the output side. FIG. 13 is a schematic diagram for describing an effect of reducing capacitive coupling with the ground potential.

By omitting third element placement part 13, as illustrated in FIG. 12, height H1 in the Z direction of semiconductor relay 1 of the present exemplary embodiment can be made lower than height H2 in the Z direction of conventional semiconductor relay 20 illustrated in FIG. 10. That is, it is possible to realize small semiconductor relay 1 with a reduced height.

In conventional semiconductor relay 20, it is also conceivable to reduce the size by reducing the size of each of first MOSFET element 3 and second MOSFET element 4. For example, the height of semiconductor relay 20 can be reduced by reducing the size in the Z direction in each of first MOSFET element 3 and second MOSFET element 4.

However, when the sizes of first MOSFET element 3 and second MOSFET element 4 are reduced, the respective on-resistances increase. In particular, in a vertical MOSFET, the drain resistance greatly contributes to the on-resistance. As the areas of first MOSFET element 3 and second MOSFET element 4 decrease, the drain area decreases and the on-resistance increases. As a result, the high-frequency characteristics of the signal transmitted by semiconductor relay 20 may deteriorate.

On the other hand, according to semiconductor relay 1 of the present exemplary embodiment, light-receiving drive element 5 is disposed to overlap second surfaces 3*b*, 4*b* in second regions 3*d*, 4*d* of first MOSFET element 3 and second MOSFET element 4 via insulating adhesive 12. As a result, it is possible to reduce the height of semiconductor relay 1 while maintaining the size of each of first MOSFET element 3 and second MOSFET element 4 to a certain extent or more. In particular, since the drain area of each of first MOSFET element 3 and second MOSFET element 4 does not significantly decrease, an increase in on-resistance can be suppressed, and deterioration in high-frequency characteristics of the signal transmitted in semiconductor relay 1 can be suppressed.

In addition, by omitting third element placement part 13, the electrode area on the output side that contributes to the parasitic capacitance can be greatly reduced. That is, the capacitive coupling between the input side and the output side is reduced, and the insertion loss is reduced. Note that, as illustrated in FIG. 12, making distance W1 longer than distance W2 makes it possible to further reduce capacitive coupling between the input side and the output side, and eventually, further reduce the insertion loss. Here, distance W2 is a distance in the X direction between each of second surface 8*b*2 of first element placement part 8*b*, second surface 9*b*2 of second element placement part 9*b*, and second surface 13*b* of third element placement part 13 and second surface 7*b*2 of element placement part 7*b* of second input terminal 7.

As illustrated in FIG. 13, the parasitic capacitance generated between third element placement part 13 and the ground potential is eliminated, and the insertion loss caused by the parasitic capacitance is reduced.

In addition, since the capacitive coupling with the ground potential is reduced, the influence of resonance by the stub can be reduced. This will be further described.

Figure 14:
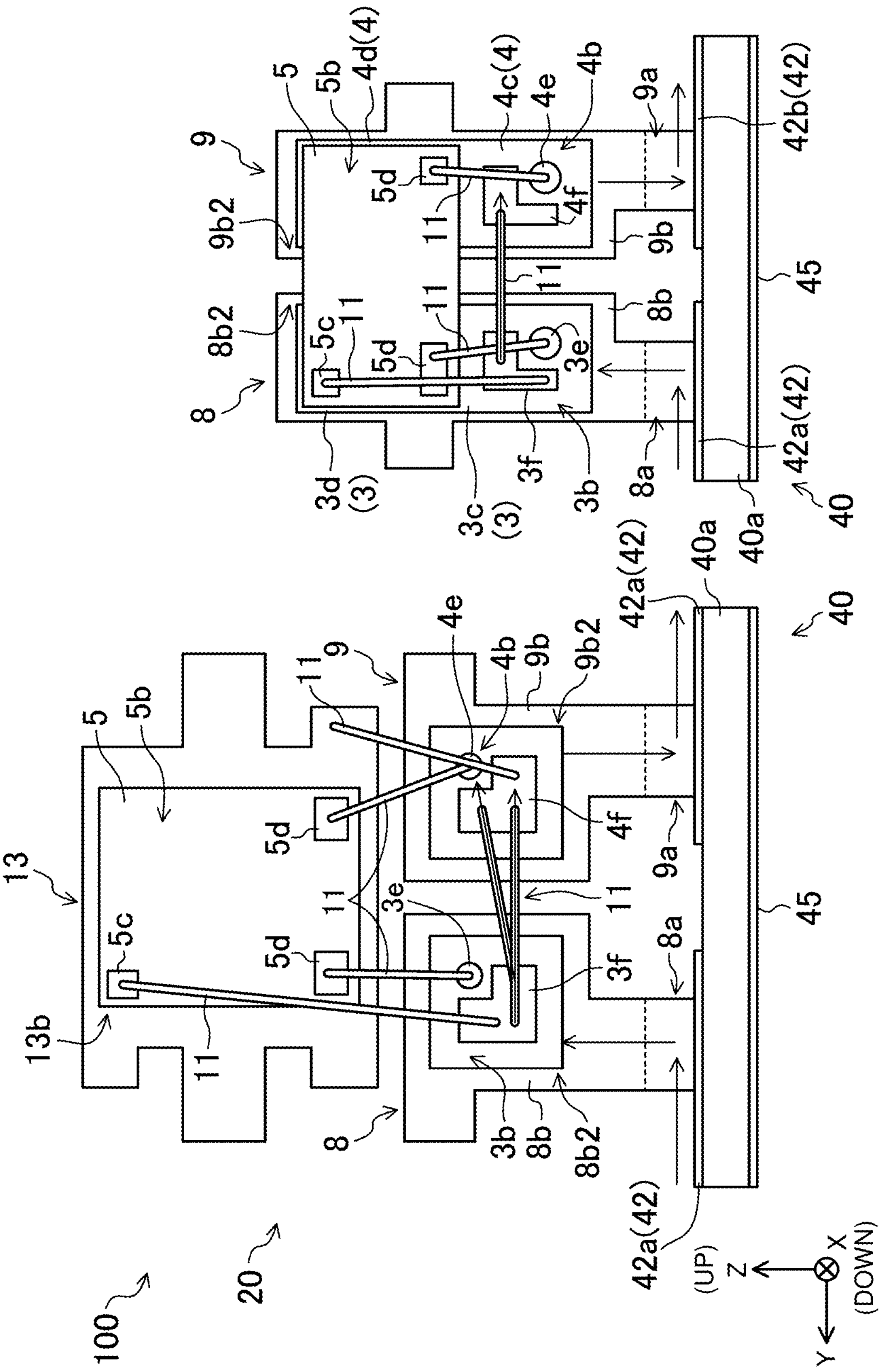
FIG. 14 is a schematic diagram for describing an effect of reducing the influence of a stub.
Figure 15:
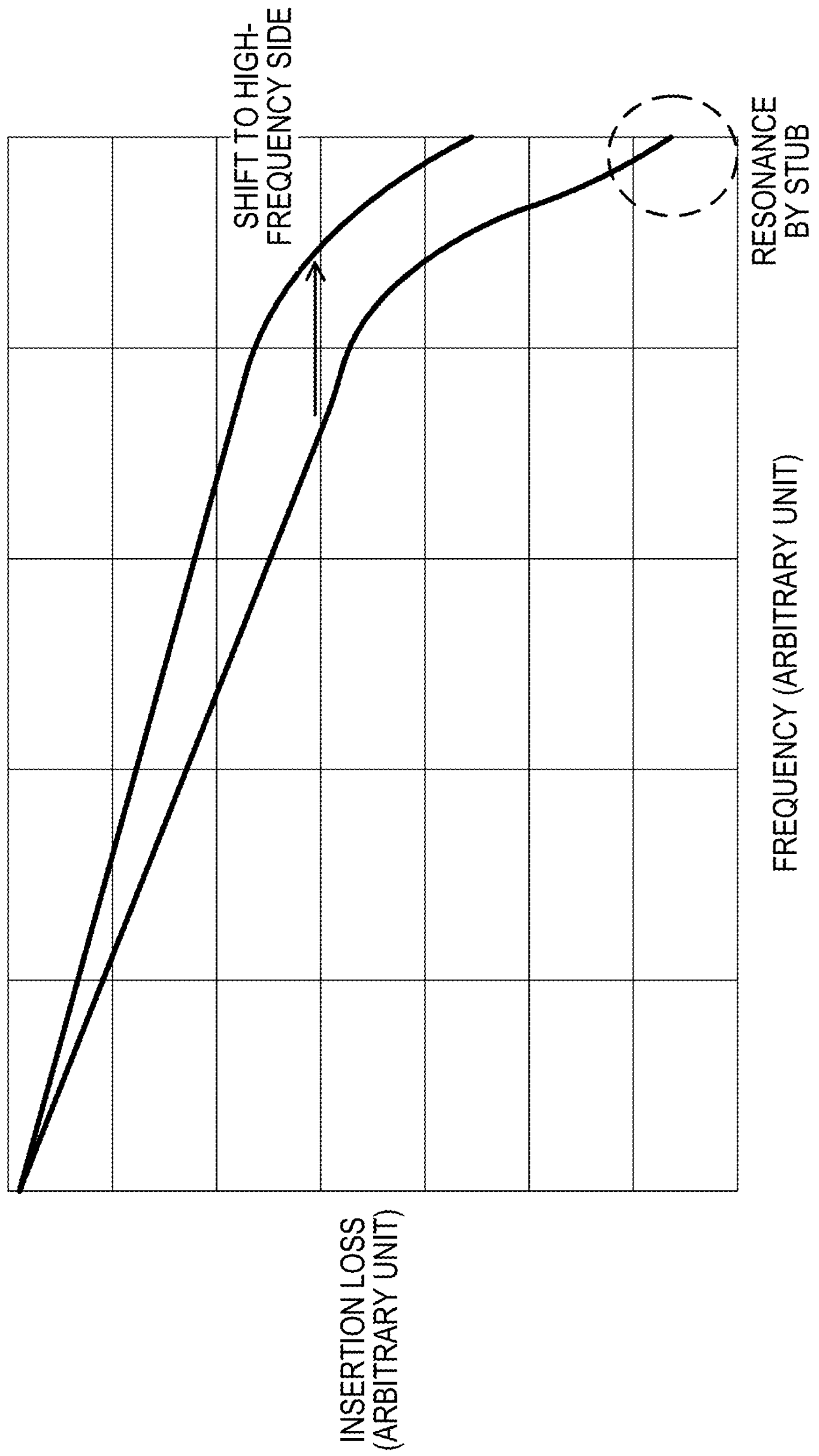
FIG. 15 is a diagram illustrating frequency dependence of insertion loss.

FIG. 14 is a schematic diagram for describing an effect of reducing the influence of a stub. FIG. 15 is a diagram illustrating frequency dependence of insertion loss. FIG. 15 is a semi-logarithmic graph in which the horizontal axis representing the frequency is with a linear scale whereas the vertical axis representing the insertion loss is with a logarithmic scale.

Of the two drawings illustrated in FIG. 14, the right drawing corresponds to FIG. 4. That is, the right drawing illustrates the inside of semiconductor relay 1 of the present exemplary embodiment. On the other hand, the left drawing illustrates the inside of conventional semiconductor relay 20 illustrated in FIG. 10.

In both semiconductor relay 1 of the present exemplary embodiment and conventional semiconductor relay 20, when first output terminal 8 and second output terminal 9 are brought into a conductive state, the signal transmission path is as indicated by the arrows illustrated in FIG. 14. In this case, wire 11 connecting source terminal 5*c* of light-receiving drive element 5 and first source terminal 3*f* of first MOSFET element 3 acts as a stub in a high frequency circuit.

Resonance frequency fc of a resonance circuit including the parasitic capacitance and wire 11 satisfies a relationship shown by Expression (1), where C is a parasitic capacitance value between the source(S) of each of first MOSFET element 3 and second MOSFET element 4 and the ground potential, and L is an inductance value of wire 11 acting as a stub.

$$fc = (1/2\pi) \times (LC)^{-1/2} \tag{1}$$

As illustrated in the left drawing of FIG. 14, in conventional semiconductor relay 20, second source terminal 4*f* of second MOSFET element 4 and third element placement part 13 are connected by wire 11. This causes light-receiving drive element 5 and second MOSFET element 4 to be electrically connected via third element placement part 13. Wire 11 also acts as a stub. The parasitic capacitance value between third element placement part 13 and the ground potential is added to parasitic capacitance value C in conventional semiconductor relay 20.

Further, as illustrated in the left drawing of FIG. 14, in conventional semiconductor relay 20, light-receiving drive element 5 is disposed above first MOSFET element 3 and second MOSFET element 4 and is separated from first MOSFET element 3 and second MOSFET element 4 along the Z direction. Thus, the length of wire 11 connecting source terminal 5*c* of light-receiving drive element 5 and first source terminal 3*f* of first MOSFET element 3 is longer than wire 11 in semiconductor relay 1 of the present exemplary embodiment illustrated on the right side of FIG. 14. Thus, inductance value L is also larger in conventional semiconductor relay 20 than in semiconductor relay 1 of the present exemplary embodiment.

That is, resonance frequency fc shown in Expression (1) is lower in conventional semiconductor relay 20 than in semiconductor relay 1 of the present exemplary embodiment.

Thus, as illustrated in FIG. 15, in conventional semiconductor relay 20, the influence of resonance due to the stub appears on the lower frequency side than in semiconductor relay 1 of the present exemplary embodiment. On the other hand, in semiconductor relay 1 of the present exemplary embodiment, the frequency characteristic of the insertion loss is entirely shifted to the high frequency side, and the attenuation of the signal on the high frequency side is suppressed. That is, it has been found that semiconductor relay 1 of the present exemplary embodiment has better high frequency characteristics with respect to insertion loss than conventional semiconductor relay 20.

Further, according to the present exemplary embodiment, the length of wire 11 connecting first source terminal 3*f* of first MOSFET element 3 and second source terminal 4*f* of second MOSFET element 4 can be shortened. This makes it possible to suppress occurrence of impedance mismatch or an increase in the degree of mismatch inside semiconductor relay 1. This will be further described.

Figure 16:
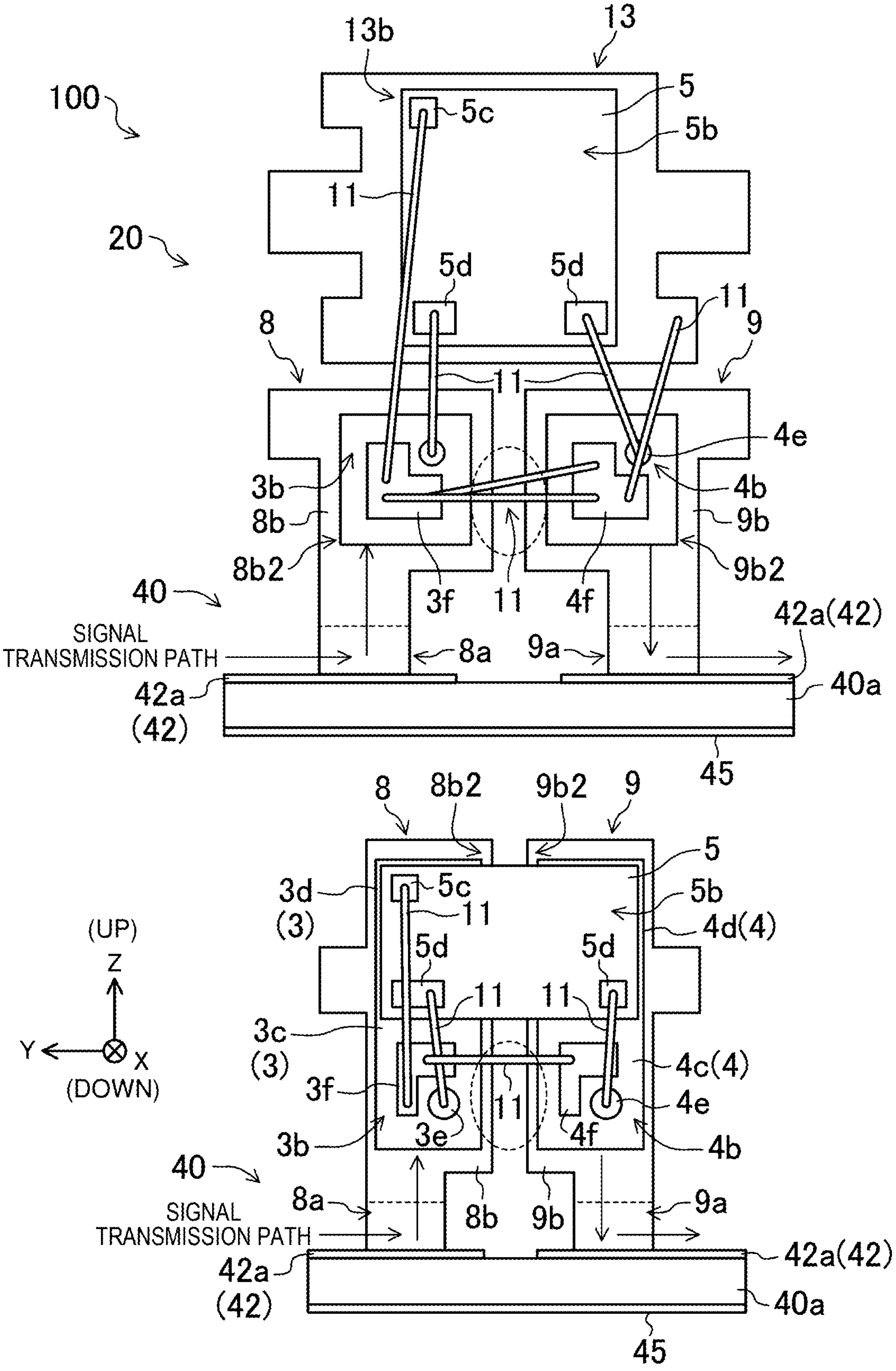
FIG. 16 is a schematic diagram for describing an effect of reducing the influence of impedance mismatch.

FIG. 16 is a schematic diagram for describing an effect of reducing the influence of impedance mismatch. The upper drawing of FIG. 16 corresponds to the left drawing of FIG. 14. That is, the upper drawing of FIG. 16 illustrates the inside of conventional semiconductor relay 20. On the other hand, the lower drawing of FIG. 16 corresponds to the right drawing of FIG. 14. That is, the lower drawing of FIG. 16 illustrates the inside of semiconductor relay 1 of the present exemplary embodiment.

As described above, to electrically connect first source terminal 3*f* of first MOSFET element 3 and second source terminal 4*f* of second MOSFET element 4, both conventional semiconductor relay 20 and semiconductor relay 1 of the present exemplary embodiment use wire 11. However, wire 11 has a higher impedance than first output terminal 8 and second output terminal 9, which causes deterioration in high-frequency characteristics of the transmission signal. Wire 11 electrically connecting first source terminal 3*f* of first MOSFET element 3 and second source terminal 4*f* of second MOSFET element 4 corresponds to a part of a signal transmission path. Thus, as the frequency of the signal increases, impedance mismatch is likely to occur in the transmission path of the signal.

On the other hand, according to the present exemplary embodiment, both first MOSFET element 3 and second MOSFET element 4 can be shrunk in the Y direction while securing a certain size in the Z direction, and an increase in on-resistance can be suppressed. In addition, as compared with conventional semiconductor relay 20, since the interval in the Y direction between first MOSFET element 3 and second MOSFET element 4 can be made close, the length of wire 11 can be shortened. As a result, semiconductor relay 1 of the present exemplary embodiment can reduce the impedance of wire 11 as compared with conventional semiconductor relay 20, and can suppress degradation of the high frequency characteristics of the transmission signal.

Further, impedance mismatch in a signal transmission path can be reduced.

In first MOSFET element 3, first region 3*c* in which a vertical MOSFET is formed and second region 3*d* in which no MOSFET is formed are disposed side by side in the Z direction. In second MOSFET element 4, first region 4*c* in which a vertical MOSFET is formed and second region 4*d* in which no MOSFET is formed are disposed side by side in the Z direction. Light-receiving drive element 5 is placed on second surface 3*b* in second region 3*d* of first MOSFET element 3 and second surface 4*b* in second region 4*d* of second MOSFET element 4.

Configuring first MOSFET element 3 and second MOSFET element 4 in this manner makes it possible to suppress occurrence of a defect or the like in an assembly step of semiconductor relay 1. That is, when light-receiving drive element 5 is placed on second surfaces 3*b*, 4*b* of first MOSFET element 3 and second MOSFET element 4 via insulating adhesive 12, heat is applied. Further, it is necessary to certainly fix light-receiving drive element 5 to first MOSFET element 3 and second MOSFET element 4 by applying pressure to light-receiving drive element 5 in the X direction.

However, when a pressure of a predetermined value or more is applied to first regions 3*c*, 4*c* in both first MOSFET element 3 and second MOSFET element 4, characteristics of the vertical MOSFET may change, or in an extreme case, first MOSFET element 3 and second MOSFET element 4 may be damaged.

On the other hand, according to the present exemplary embodiment, since light-receiving drive element 5 is placed in second regions 3*d*, 4*d*, which are the element non-formation regions, the above-described problems can be avoided from occurring, and the characteristics of first MOSFET element 3 and second MOSFET element 4 can be stabilized. In addition, it is possible to reduce problems in the assembly step and improve the manufacturing yield of semiconductor relay 1.

In addition, by fixing light-receiving drive element 5 to second surfaces 3*b*, 4*b* of first MOSFET element 3 and second MOSFET element 4 with insulating adhesive 12, a short circuit can be prevented from occurring between first MOSFET element 3 and second MOSFET element 4.

Sealing resin 10 includes light-shielding resin 10*a* and light-transmitting resin 10*b* that transmits at least light from light emitting element 2. Light emitting element 2 and light receiving element 51 face each other in the X direction with light-transmitting resin 10*b* interposed therebetween.

With this configuration, light from light emitting element 2 can be certainly received by light receiving element 51.

First output-side external terminal part 8*a* and the second output-side external terminal part 9*a*, and input-side external terminal parts 6*a*, 7*a* provided in first input terminal 6 and second input terminal 7 are provided so as to protrude from sealing resin 10 toward the outside in the Y direction and along the lower surface of sealing resin 10.

In this case, input-side external terminal parts 6*a*, 7*a* provided in first input terminal 6 and second input terminal 7 are provided at an interval along the Y direction. First output-side external terminal part 8*a* and second output-side external terminal part 9*a* are provided at an interval along the Y direction.

This configuration makes it possible to realize surface mount type semiconductor relay 1 in which the lower surface of sealing resin 10 serves as a mounting surface.

Electric circuit 100 according to the present exemplary embodiment includes at least semiconductor relay 1 and circuit board 40. In circuit board 40, first wiring 41 and second wiring 42 are formed on the upper surface of dielectric substrate 40*a*.

First wiring 41 is formed of a pair of wirings 41*a*, 41*b* provided at an interval in the Y direction and parallel to each other whose longitudinal direction are in the X direction. Second wiring 42 is formed of a pair of wirings 42*a*, 42*b* provided at an interval in the Y direction whose longitudinal directions are in the Y direction.

First input terminal 6 and second input terminal 7 are connected to first wiring 41 such that the lower surfaces of input-side external terminal parts 6*a*, 7*a* are in contact with the upper surfaces of the pair of wirings 41*a*, 41*b* constituting first wiring 41.

First output terminal 8 and second output terminal 9 are connected to second wiring 42 such that the lower surfaces of first output-side external terminal part 8*a* and second output-side external terminal part 9*a* are in contact with the upper surfaces of the pair of wirings 42*a*, 42*b* constituting second wiring 42.

First wiring 41 is an input wiring of signals passed or blocked by semiconductor relay 1, and second wiring 42 is a signal output wiring (signal line).

According to electric circuit 100 of the present exemplary embodiment, passing and blocking of a signal with semiconductor relay 1 can be performed with a simple configuration.

On the upper surface of circuit board 40, third wiring 43 is further formed so as to be separated from second wiring 42 and to sandwich second wiring 42. Third wiring 43 is electrically connected to ground plane 45 formed on the lower surface of circuit board 40, and ground plane 45 is electrically connected to the ground potential.

Disposing third wiring 43 connected to the ground potential so as to sandwich second wiring 42 makes it possible to suppress mixing of radiation noise or the like into the transmission signal propagating through second wiring 42. In addition, propagation of radiation noise or the like from second wiring 42 to another electronic component (not illustrated) mounted on circuit board 40 can be suppressed. In addition, it is possible to easily configure a signal transmission circuit that transmits a high frequency signal passed or blocked by semiconductor relay 1.

Modifications

Figure 17:
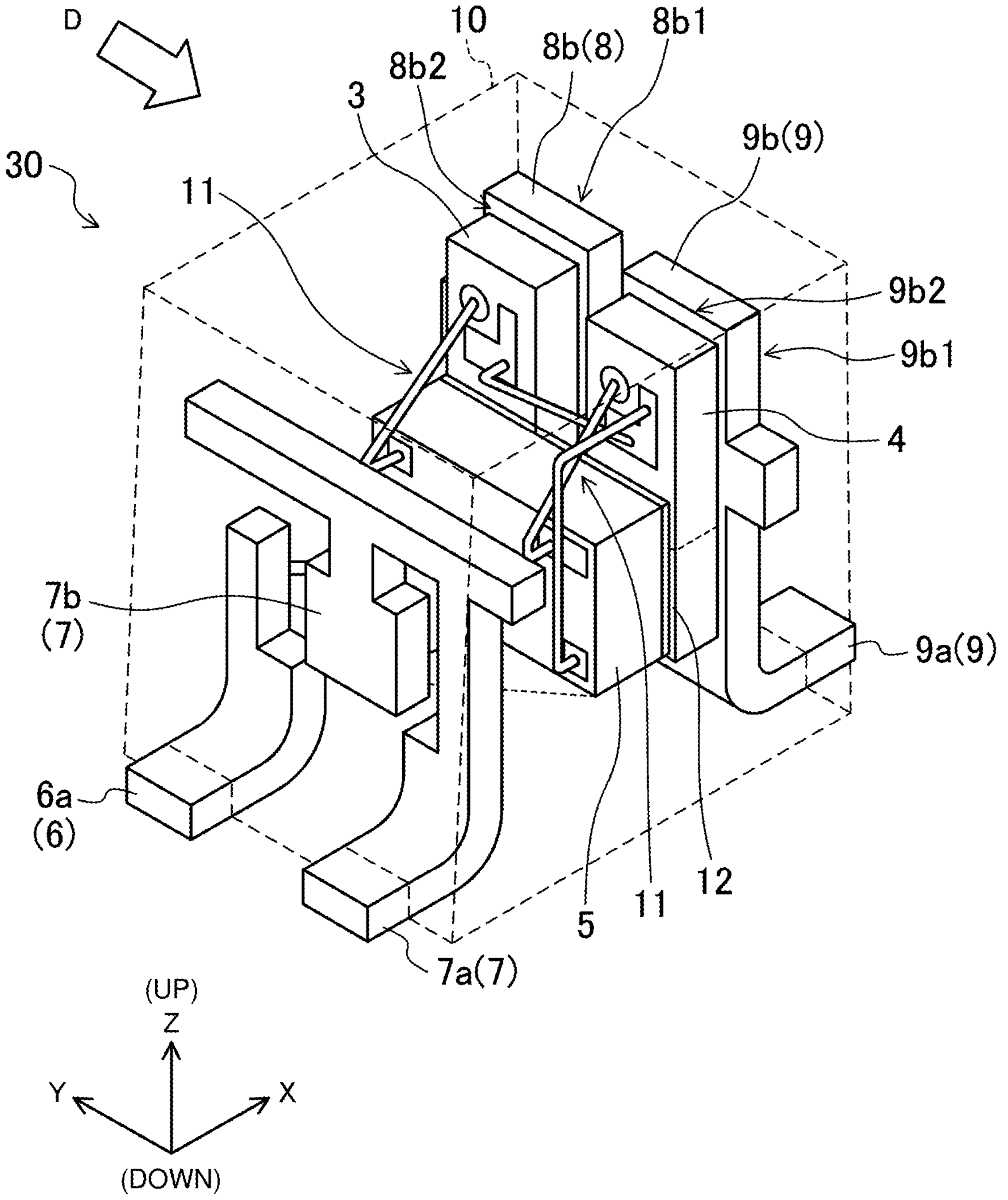
FIG. 17 is a perspective view of a semiconductor relay according to a modification.
Figure 18:
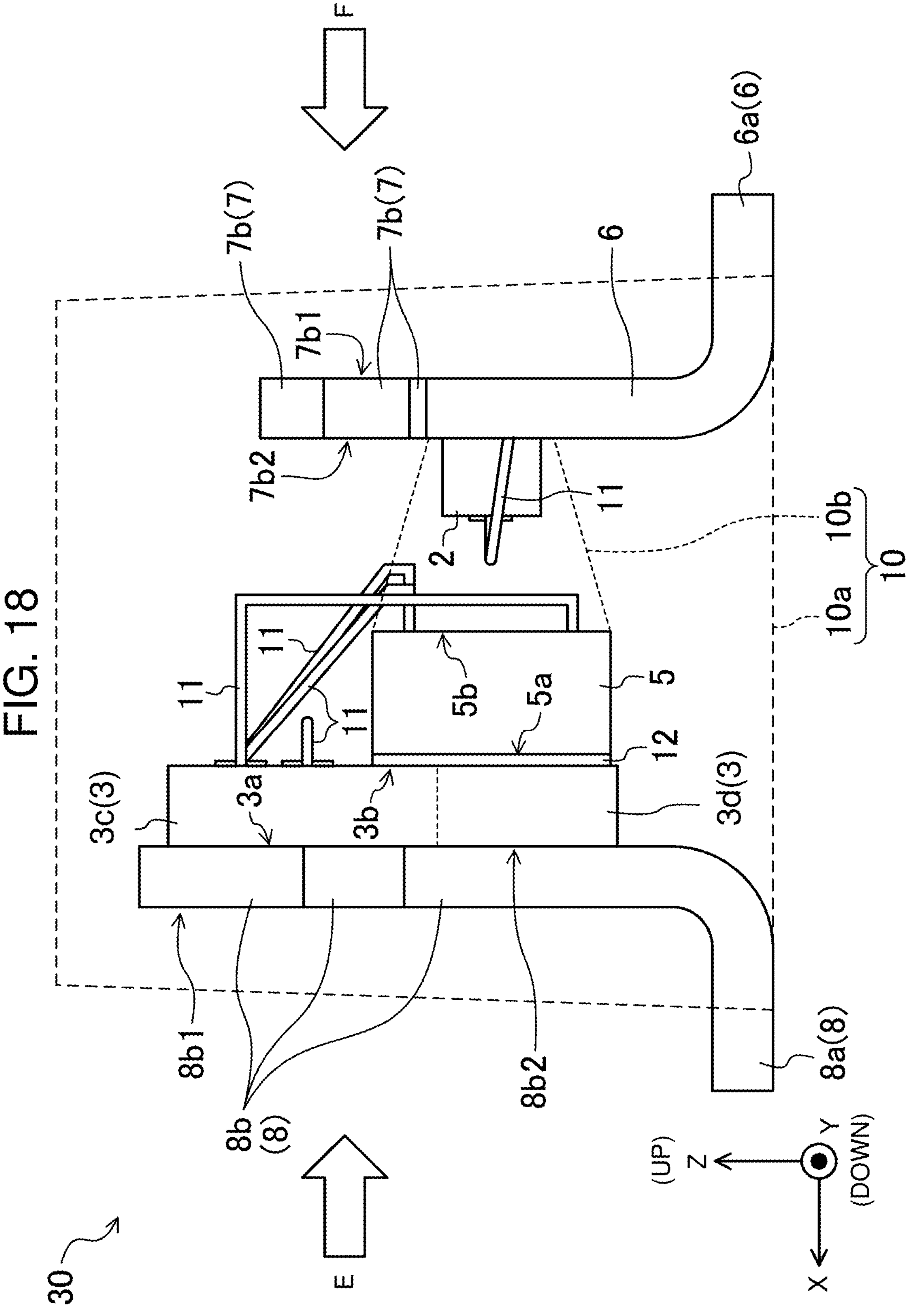
FIG. 18 is a side view of the semiconductor relay according to the modification as viewed from direction D illustrated in FIG. 17.

FIG. 17 is a perspective view of semiconductor relay 30 according to the present modification, and FIG. 18 is a side view of semiconductor relay 30 as viewed from direction D illustrated in FIG. 17.

Figure 19:
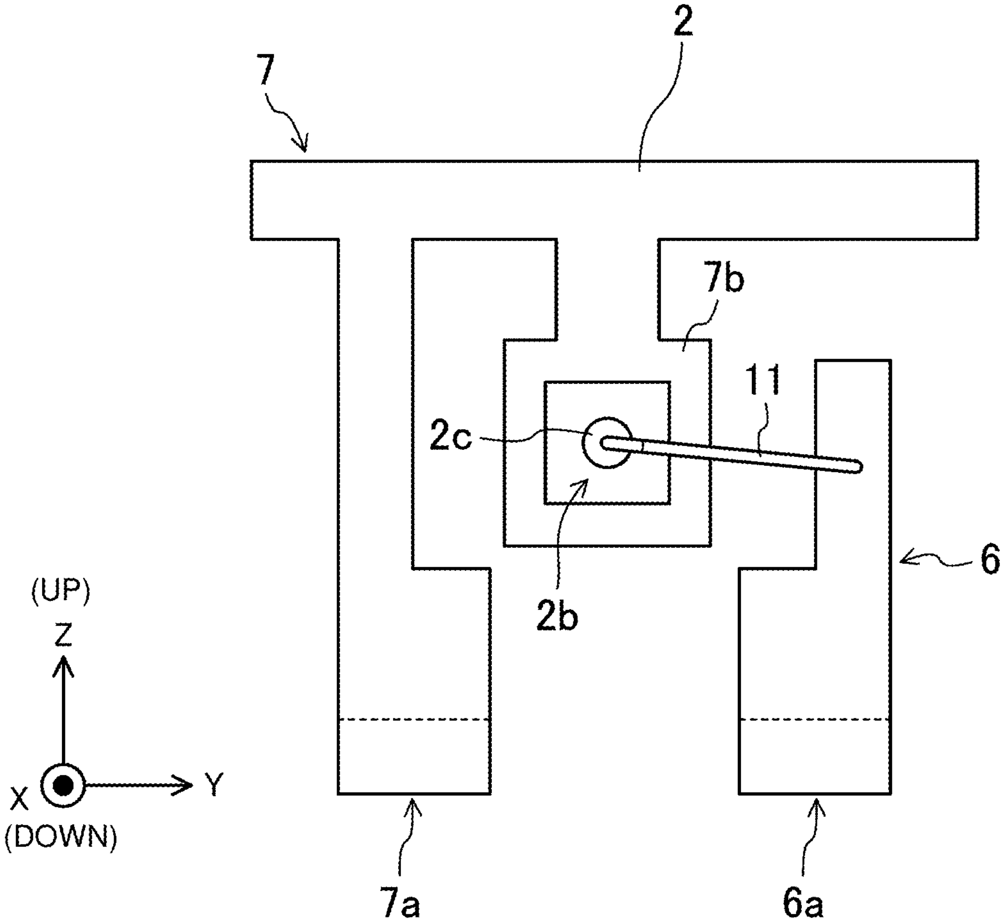
FIG. 19 is a view of a first input terminal and a second input terminal on which a light emitting element is placed as viewed from direction E illustrated in FIG. 18.
Figure 20:
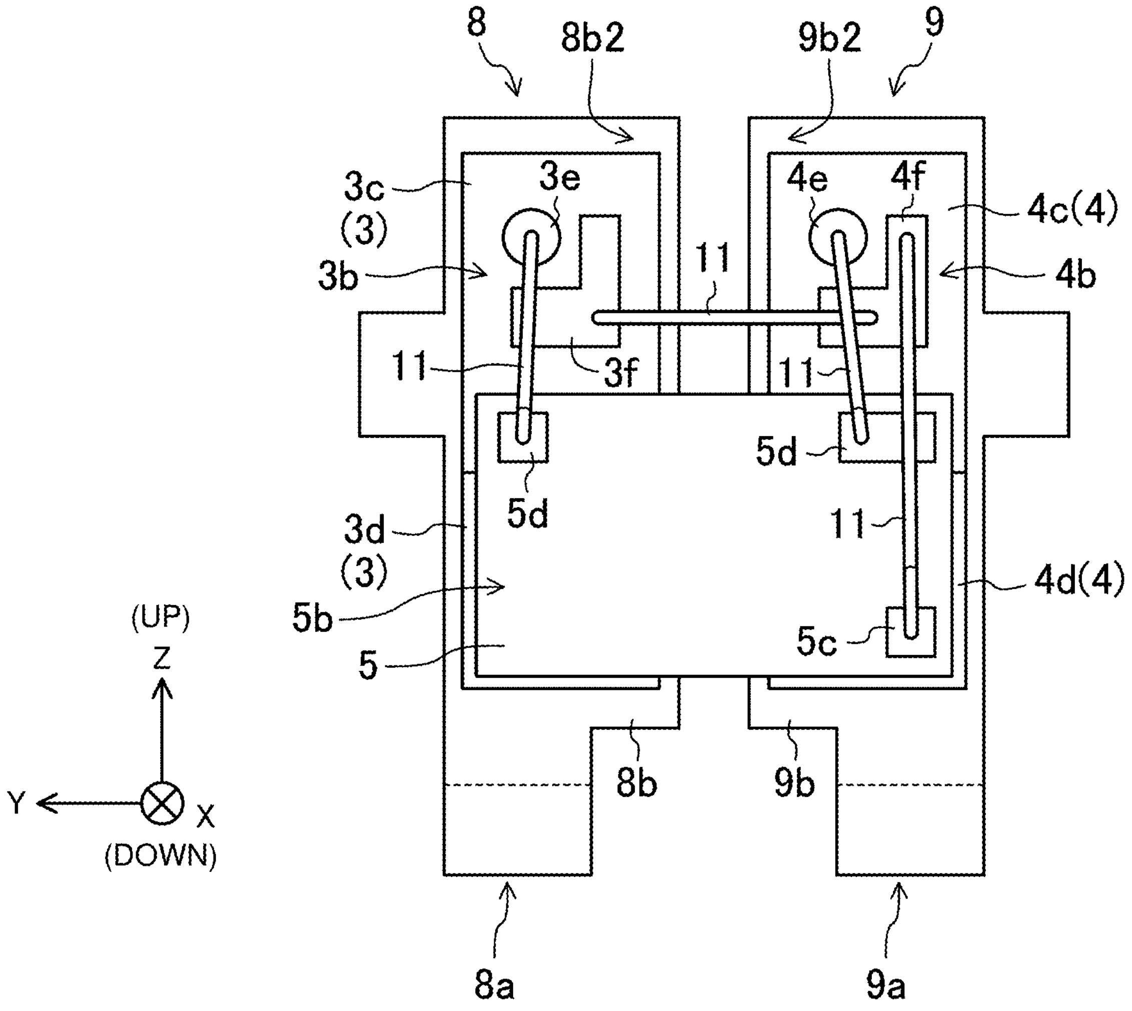
FIG. 20 is a view of a first output terminal and a second output terminal on which a light-receiving drive element, a first MOSFET element, and a second MOSFET element are placed as viewed from direction F illustrated in FIG. 18.

FIG. 19 illustrates a view of first input terminal 6 and second input terminal 7 on which the light emitting element is placed as viewed from direction E illustrated in FIG. 18, and FIG. 20 illustrates a view of first input terminal 6 and second input terminal 7 on which light-receiving drive element 5, first MOSFET element 3, and second MOSFET element 4 are placed as viewed from direction F illustrated in FIG. 18.

Figure 21:
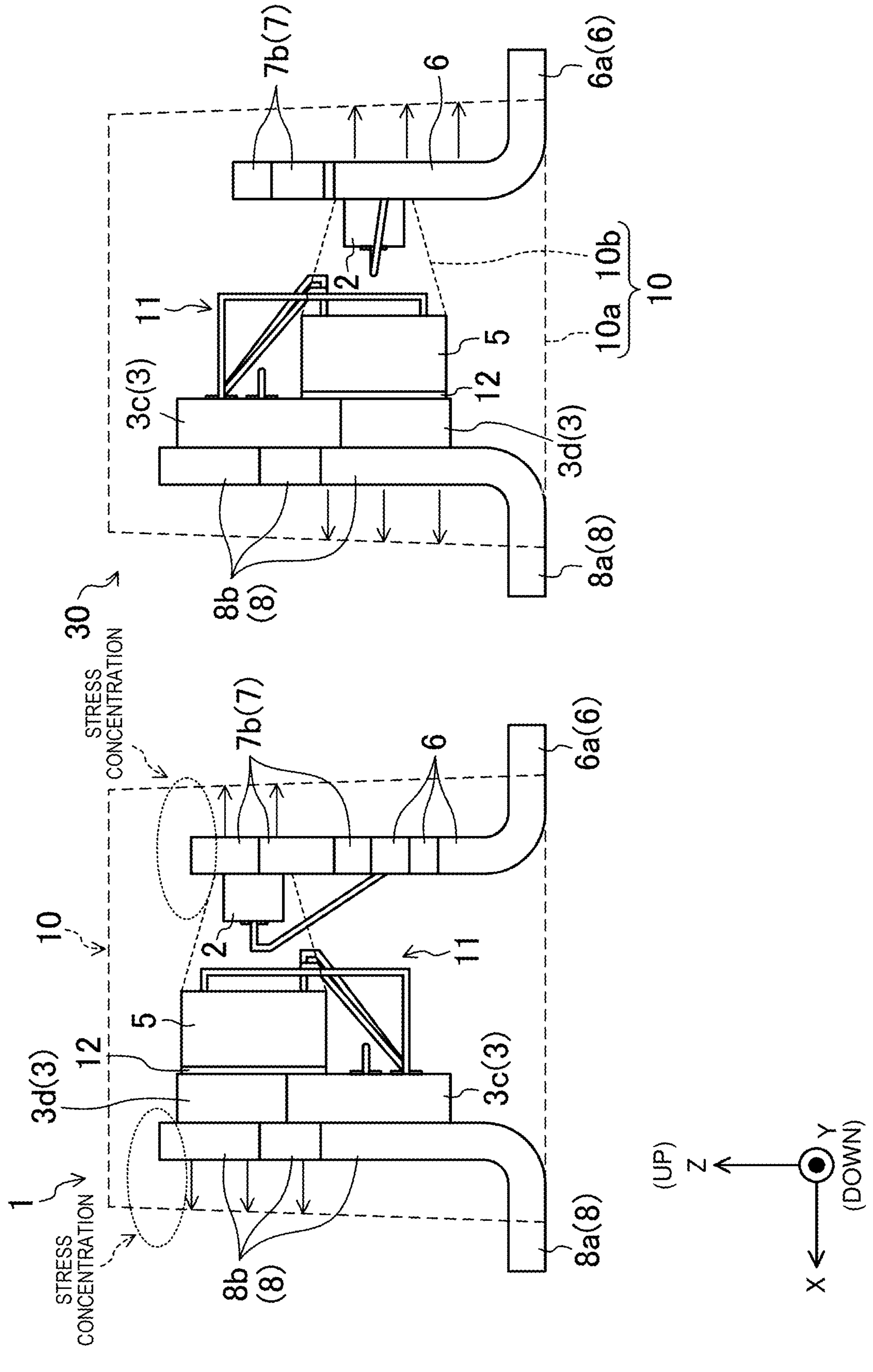
FIG. 21 is a schematic diagram for describing an effect of improving reflow resistance.
Figure 22:
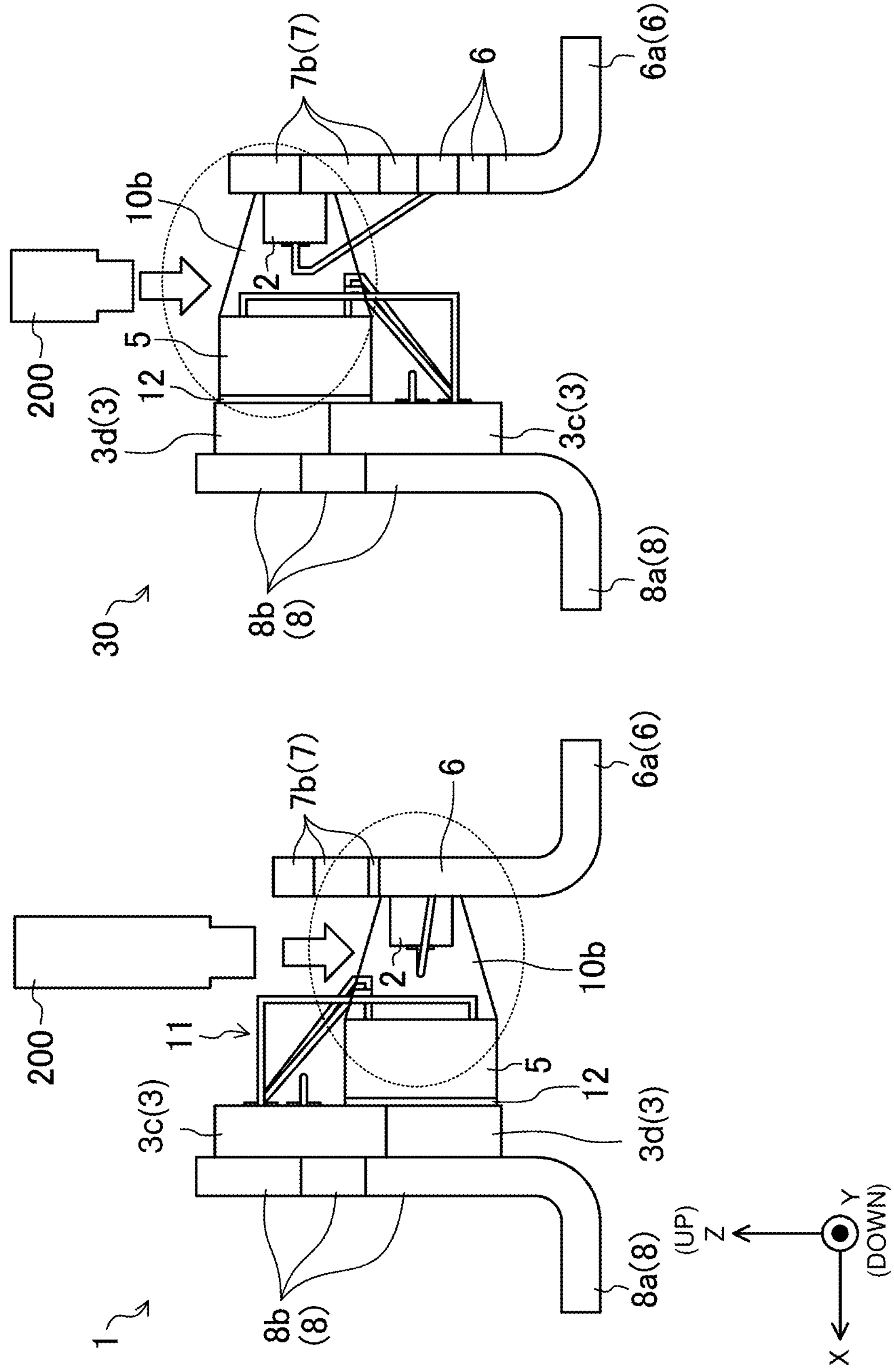
FIG. 22 is a schematic view for describing ease of manufacturing in an optical coupling part formation step.

FIG. 21 is a schematic diagram for describing an effect of improving reflow resistance, and FIG. 22 is a schematic diagram for describing ease of manufacturing in an optical coupling part formation step.

For convenience of description, in FIGS. 17 to 22, the same parts as those in the exemplary embodiment are denoted by the same reference marks, and detailed description thereof is omitted. In FIGS. 17, 18, and 21, outlines of sealing resin 10 and light-shielding resin 10*a* and light-transmitting resin 10*b* constituting the sealing resin are indicated by broken lines. In FIG. 22, illustration of light-shielding resin 10*a* is omitted.

Semiconductor relay 30 of the present modification illustrated in FIGS. 17 to 20 is different from semiconductor relay 1 of the exemplary embodiment illustrated in FIGS. 1 to 4 in the following points.

First, in first MOSFET element 3 and second MOSFET element 4, first regions 3*c*, 4*c* are disposed above second regions 3*d*, 4*d* along the Z direction. This causes light-receiving drive element 5 to be disposed below first regions 3*c*, 4*c* of first MOSFET element 3 and second MOSFET element 4 in the Z direction.

According to the present modification, heat treatment resistance in the manufacturing step of semiconductor relay 30 can be improved.

In manufacturing semiconductor relays 1, 30, a so-called reflow step is performed in which components are positioned, temporarily fixed to another component using a silver paste, cream solder, or the like, and then the whole is heat-treated to electrically connect the components. In this case, semiconductor relays 1, 30 that are sealed in resin are subjected to heat treatment at a temperature of about 100° C. to 300° C. Silicone resins generally have a larger linear expansion coefficient than epoxy resins.

That is, in the reflow step, light-transmitting resin 10*b* thermally expands more than light-shielding resin 10*a*. In this case, the force by which element placement part 7*b* of second input terminal 7, first element placement part 8*b* of first output terminal 8, and second element placement part 9*b* of second output terminal 9 are pushed from light-transmitting resin 10*b* in the X direction toward the side surface of sealing resin 10 is increased.

As illustrated on the left side of FIG. 21, in semiconductor relay 1 according to the exemplary embodiment, element placement part 7*b* of second input terminal 7, first element placement part 8*b*, and second element placement part 9*b* are located relatively on the upward along the Z direction inside sealing resin 10. The outer shape of sealing resin 10 is the forward tapered shape described above. Thus, sealing resin 10 covering first surface 7*b*1 of element placement part 7*b* of second input terminal 7, first surface 8*b*1 of first element placement part 8*b*, and first surface 9*b*1 of second element placement part 9*b* becomes thinner upward.

Thus, when element placement part 7*b* of second input terminal 7, first element placement part 8*b*, and second element placement part 9*b* are pressed in the X direction due to the thermal expansion of light-transmitting resin 10*b*, stress concentrates on a thin portion of sealing resin 10. In this case, a portion where sealing resin 10 is thin has insufficient strength, and cracking may occur.

On the other hand, as illustrated on the right side of FIG. 21, in semiconductor relay 30 of the present modification, light-transmitting resin 10*b* covering light-receiving drive element 5 is disposed below first region 3*c* of first MOSFET element 3 and first region 4*c* of second MOSFET element 4 along the Z direction. Thus, sealing resin 10 covering first surface 7*b*1 of element placement part 7*b* of second input terminal 7, first surface **8*b*1 of first element placement part 8*b*, and first surface 9*b*1 of second element placement part 9*b* in the semiconductor relay is thicker than in semiconductor relay 1** of the exemplary embodiment.

Thus, even when element placement part **7*b*, first element placement part 8*b*, and second element placement part 9*b* of second input terminal 7 are pressed in the X direction due to thermal expansion of light-transmitting resin 10*b*, the strength of sealing resin 10** can be secured, and reflow resistance can be improved.

In addition, light-receiving drive element 5 in semiconductor relay 30 of the present modification is located lower than in semiconductor relay 1 of the exemplary embodiment, and the center of gravity is lowered downward. Thus, stability when semiconductor relay 30 is mounted on circuit board 40 is improved. In accordance with the position of light-receiving drive element 5, the positions of element placement part **7*b* of second input terminal 7 and light emitting element 2 are also shifted downward as compared with the case of semiconductor relay 1 of the exemplary embodiment. As a result, the length of each of first input terminal 6 and second input terminal 7 in the Z direction is shortened. In other words, in each of first input terminal 6 and second input terminal 7, the area of the portion facing first output terminal 8 and second output terminal 9** is reduced. This makes it possible to reduce capacitive coupling between the input side and the output side and reduce insertion loss.

In manufacturing semiconductor relays 1, 30, light-shielding resin **10*a* is sealed up to the lower side of light emitting element 2 and light-receiving drive element 5, and then light-transmitting resin 10*b* is filled and sealed between light emitting element 2 and light-receiving drive element 5**.

According to the present modification, wire 11 connecting first source terminal **3*f* of first MOSFET element 3 and second source terminal 4*f* of second MOSFET element 4 is located above light-receiving drive element 5** along the Z direction.

Thus, when light-transmitting resin **10*b* is filled, the light-transmitting resin 10*b* before curing is not applied to wire 11. Thus, when light-transmitting resin 10*b* is cured or when heat is applied to semiconductor relay 30, disconnection of wire 11 is unlikely to occur, and the manufacturing yield of semiconductor relay 30 can be improved. Further, the reliability of semiconductor relay 30** can be improved.

On the other hand, in semiconductor relay 1 of the exemplary embodiment, the step of forming the optical coupling part with light-transmitting resin **10*b* is easier than that in semiconductor relay 30** of the modification.

The left side of FIG. 22 illustrates a step of forming the optical coupling part in semiconductor relay 30 according to the modification, and the right side of FIG. 22 illustrates a step of forming the optical coupling part in semiconductor relay 1 according to the exemplary embodiment.

As illustrated on the left side of FIG. 22, in semiconductor relay 30 of the modification, nozzle 200 for dropping and applying light-transmitting resin **10*b* needs to enter the inside of semiconductor relay 30. In this case, it is necessary to devise the shape of nozzle 200 in order to avoid contact of nozzle 200 with wire 11, first input terminal 6, or second input terminal 7. In addition, the movement control of nozzle 200** becomes complicated.

On the other hand, in semiconductor relay 1 of the exemplary embodiment, the entry amount of nozzle 200 can be reduced as compared with semiconductor relay 30 of the modification. Thus, the shape of nozzle 200 can be simplified. In addition, the movement control of nozzle 200 is simplified, and the step of forming light-transmitting resin **10*b***, that is, the optical coupling part is facilitated.

As illustrated in the lower diagram of FIG. 16, in semiconductor relay 1 illustrated in the exemplary embodiment, wire 11 is used to electrically connect first source terminal **3*f* of first MOSFET element 3 and second source terminal 4*f* of second MOSFET element 4. Wire 11 is disposed below light-receiving drive element 5** in the Z direction.

Wire 11 forms a part of a transmission path of a transmission signal. In general, as the transmission path goes away from the ground potential, in this case, third wiring 43 and ground plane 45, the impedance of the transmission path increases, and the degree of impedance mismatch increases in semiconductor relay 1 or electric circuit 100 including semiconductor relay 30.

In semiconductor relay 1 illustrated in the exemplary embodiment, for example, as illustrated in the lower drawing of FIG. 16, wire 11 forming a part of the transmission path of a transmission signal is disposed below light-receiving drive element 5 along the Z direction, and thus the distance between wire 11 and third wiring 43 or ground plane 45 can be shortened. This makes it possible to further increase the high-frequency characteristics of the transmission signal in semiconductor relay 1 as compared with semiconductor relay 30 illustrated in the modification.

INDUSTRIAL APPLICABILITY

Since the semiconductor relay of the present disclosure can be downsized and can reduce insertion loss, the semiconductor relay is useful as an element for passing and blocking a high frequency signal.

REFERENCE MARKS IN THE DRAWINGS

- 1, 20, 30: semiconductor relay
- 2: light emitting element
- 3: first MOSFET element
- **3*a***: first surface
- **3*b***: second surface
- **3*c***: element formation region (first region)
- **3*d***: element non-formation region (second region)
- 4: second MOSFET element
- **4*a***: first surface
- **4*b***: second surface
- **4*c***: element formation region (first region)
- **4*d***: element non-formation region (second region)
- 5: light-receiving drive element
- **5*b***: second surface
- 51: light receiving element
- 52: drive circuit
- 6: first input terminal
- **6*a***: input-side external terminal part
- 7: second input terminal
- **7*a***: input-side external terminal part
- **7*b***: element placement part
- 8: first output terminal
- **8*a***: first output-side external terminal part
- **8*b***: first element placement part
- 9: second output terminal
- **9*a***: second output-side external terminal part
- **9*b***: second element placement part
- 10: sealing resin
- **10*a***: light-shielding resin
- **10*b***: light-transmitting resin
- 11: wire
- 12: insulating adhesive

13: third element placement part
40: circuit board
**40*a***: dielectric substrate
41: first wiring
42: second wiring
43: third wiring
44: conductive via
45: ground plane
100: electric circuit
200: nozzle

The invention claimed is:

1. A semiconductor relay mounted on a circuit board, the semiconductor relay comprising:
a first input terminal;
a second input terminal;
a light emitting element electrically connected to the first input terminal and the second input terminal;
a light receiving element that receives light emitted from the light emitting element;
a light-receiving drive element that includes the light receiving element and outputs a drive signal;
a first MOSFET element that is turned on and off by the drive signal output from the light-receiving drive element;
a second MOSFET element that is turned on and off by the drive signal output from the light-receiving drive element;
a first output terminal including a first element placement part and a first output-side external terminal part;
a second output terminal including a second element placement part and a second output-side external terminal part; and
a sealing resin that seals the light emitting element, the light-receiving drive element, the first MOSFET element, the second MOSFET element, the first input terminal, the second input terminal, the first output terminal, and the second output terminal,
wherein the light emitting element and the light receiving element face each other at a predetermined interval,
each of the first MOSFET element and the second MOSFET element includes a first surface and a second surface facing the first surface,
a direction in which the light receiving element and the light emitting element face each other is a same direction as a direction in which the first surface and the second surface face each other,
the first surface of the first MOSFET element is placed on the first element placement part,
the first surface of the second MOSFET element is placed on the second element placement part,
the first element placement part extends in an up-down direction,
the first output-side external terminal part extends from the first element placement part along a lower surface of the sealing resin and protrudes from the sealing resin, and
the light-receiving drive element is placed on the second surface of the first MOSFET element and the second surface of the second MOSFET element.

2. The semiconductor relay according to claim 1, wherein the light-receiving drive element is fixed to the second surface of the first MOSFET element and the second surface of the second MOSFET element with an insulating adhesive.

3. The semiconductor relay according to claim 1, wherein
the sealing resin includes a light-shielding resin and a light-transmitting resin that transmits light from the light emitting element, and
the light emitting element and the light receiving element face each other with the light-transmitting resin interposed between the light emitting element and the light receiving element.

4. The semiconductor relay according to claim 1, wherein
in each of the first MOSFET element and the second MOSFET element, a first region in which a MOSFET is formed and a second region in which a MOSFET is not formed are arranged in the up-down direction, and
the light-receiving drive element is placed on the second surface in the second region of each of the first MOSFET element and the second MOSFET element.

5. The semiconductor relay according to claim 4, wherein in each of the first MOSFET element and the second MOSFET element, the first region is disposed above the second region.

6. The semiconductor relay according to claim 4, wherein in each of the first MOSFET element and the second MOSFET element, the first region is disposed below the second region.

7. The semiconductor relay according to claim 1, wherein
the first MOSFET element includes a first source terminal,
the second MOSFET element includes a second source terminal,
the first source terminal and the second source terminal are connected to each other by a wire, and
the wire is located above below the light-receiving drive element.

8. The semiconductor relay according to claim 1, wherein
the first MOSFET element includes a first source terminal,
the second MOSFET element includes a second source terminal,
the first source terminal and the second source terminal are connected to each other by a wire, and
the wire is located below the light-receiving drive element.

9. The semiconductor relay according to claim 1, wherein
the first output-side external terminal part, the second output-side external terminal part, a first input-side external terminal part provided at the first input terminal, and a second input-side external terminal part provided at the second input terminal are provided protruding outward from the sealing resin along the lower surface of the sealing resin,
the first input-side external terminal part and the second input-side external terminal part are provided at an interval from each other, and
the first output-side external terminal part and the second output-side external terminal part are provided at an interval from each other.

10. An electric circuit comprising:
the semiconductor relay according to claim 9; and
the circuit board,
wherein the circuit board includes a first wiring and a second wiring formed on an upper surface of a dielectric substrate,
the first wiring is formed of a pair of wirings provided at an interval,
the second wiring is formed of a pair of wirings provided at an interval,
the first input terminal is connected to the first wiring, and a lower surface of the first input-side external terminal part is in contact with an upper surface of one of the pair of wirings forming the first wiring,
the second input terminal is connected to the first wiring, and a lower surface of the second input-side external terminal part is in contact with an upper surface of the other of the pair of wirings forming the first wiring, the first output terminal is connected to the second wiring, and a lower surface of the first output-side external terminal part is in contact with an upper surface of one of the pair of wirings forming the second wiring, and the second output terminal is connected to the second wiring, and a lower surface of the second first output-side external terminal part is in contact with an upper surface of the other of the pair of wirings forming the second wiring.

11. The electric circuit according to claim 10, wherein a third wiring is further formed on an upper surface of the circuit board, the third wiring being separated from the second wiring and sandwiching the second wiring, the third wiring is electrically connected to a ground plane formed on a lower surface of the circuit board, and the ground plane is electrically connected to a ground potential.

12. The semiconductor relay according to claim 1, wherein the first element placement part includes a protrusion, and an extending direction of the protrusion and an extending direction of the first output-side external terminal part are different.

13. The semiconductor relay according to claim 12, wherein the extending direction of the protrusion and the extending direction of the first output-side external terminal part are orthogonal to each other.

* * * * *